(12) United States Patent
Hisamune et al.

(10) Patent No.: US 6,373,096 B1
(45) Date of Patent: Apr. 16, 2002

(54) METHOD OF MANUFACTURING SEMICONDUCTOR DEVICE, NONVOLATILE SEMICONDUCTOR MEMORY DEVICE AND METHOD OF MANUFACTURING THE SAME

(75) Inventors: Yoshiaki Hisamune; Hidetoshi Nakata, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/489,332

(22) Filed: Jan. 21, 2000

(30) Foreign Application Priority Data

Jan. 22, 1999 (JP) .............................. 11-014707

(51) Int. Cl.[7] .................. H01L 29/788; H01L 21/8247
(52) U.S. Cl. ........................ 257/316; 438/257
(58) Field of Search ................... 438/257–267; 257/315–322

(56) References Cited

U.S. PATENT DOCUMENTS

| | | | | |
|---|---|---|---|---|
| 5,111,257 A | * | 5/1992 | Andoh et al. | |
| 5,641,989 A | * | 6/1997 | Tomioka | 257/630 |
| 5,693,971 A | * | 12/1997 | Gonzalez | 257/314 |
| 5,796,140 A | * | 8/1998 | Tomioika | 257/316 |
| 5,814,850 A | * | 9/1998 | Iwasa | 257/296 |
| 5,847,426 A | * | 12/1998 | Bergemont | 257/315 |
| 5,985,720 A | * | 11/1999 | Saitoh | 438/266 |

FOREIGN PATENT DOCUMENTS

| | | |
|---|---|---|
| JP | 6-283721 | 10/1994 |
| JP | 8-125145 | 5/1996 |
| JP | 8-130264 | 5/1996 |
| JP | 9-181161 | 7/1997 |
| JP | 9-321135 | 12/1997 |
| JP | A 10-116894 | 5/1998 |
| JP | A 10-303391 | 11/1998 |

* cited by examiner

*Primary Examiner*—Richard Booth
(74) *Attorney, Agent, or Firm*—Young & Thompson

(57) ABSTRACT

Provided are a method of manufacturing a semiconductor, a nonvolatile semiconductor memory device and a method of manufacturing the same, wherein: the memory device has a plurality of memory cells; a buried diffusion layer serves as a signal line; and, a buried diffusion layer disposed adjacent to each of opposite end portions of a lower floating gate is free from variations in width resulted from misalignment occurring in an optical aligner. In the memory device, for example: the floating gate is formed in an active region of a P-type semiconductor substrate through a gate oxide film; an N-type drain region and an N-type source region are formed in opposite end portions of the floating gate; and, a pair of device isolation shielding electrode extends in parallel with the floating gate outside both the drain region and the source region to cover adjacent ones of the memory cells.

10 Claims, 24 Drawing Sheets section B-B section C-C section A-A section B-B section C-C

FIG. 7A section A-A
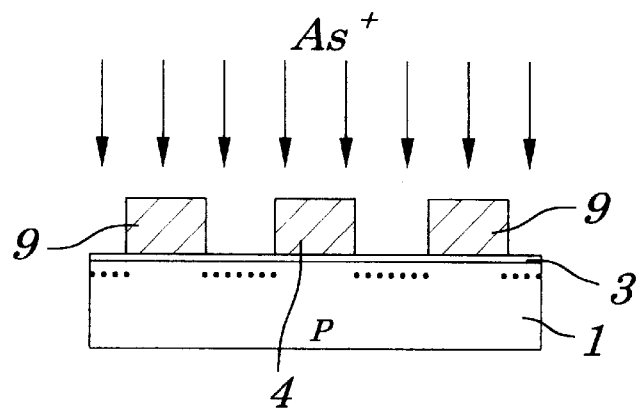
FIG. 7B section B-B
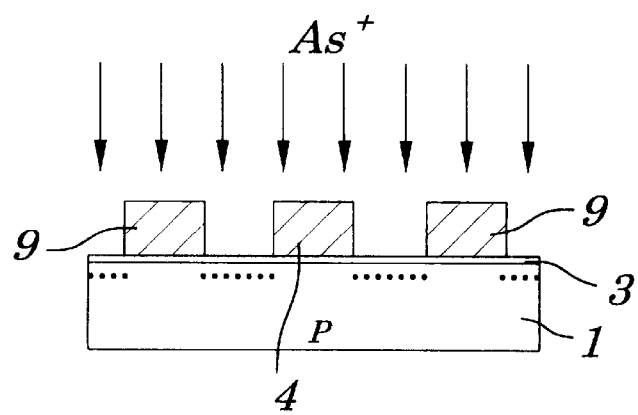
FIG. 7C section C-C
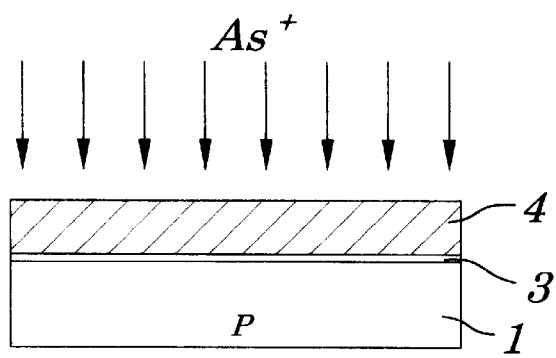

section A-A section B-B section C-C section A-A section B-B section C-C section A-A section B-B section C-C section A-A section B-B section C-C section A-A section B-B section C-C section A-A section B-B section C-C section A-A section B-B section C-C section A-A section B-B section C-C

*FIG. 20A*  section A-A
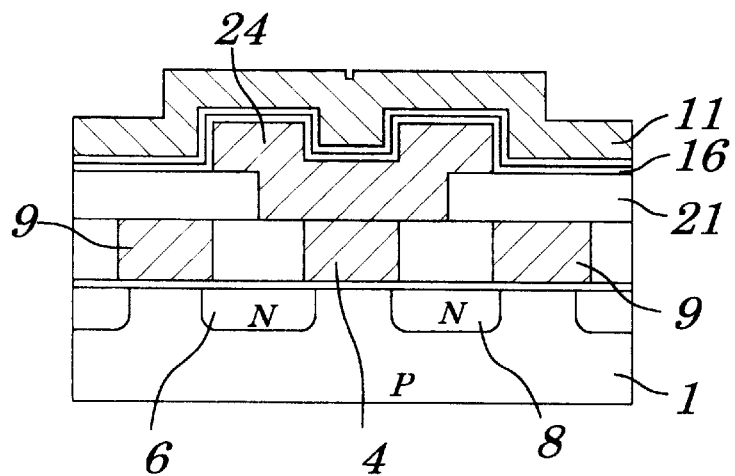
*FIG. 20B*  section B-B
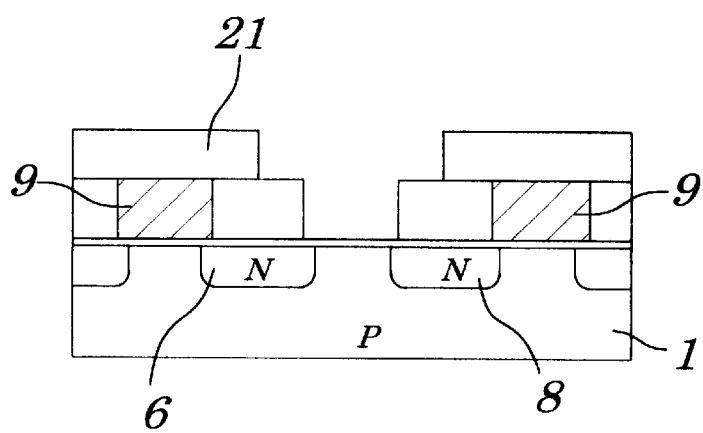
*FIG. 20C*  section C-C
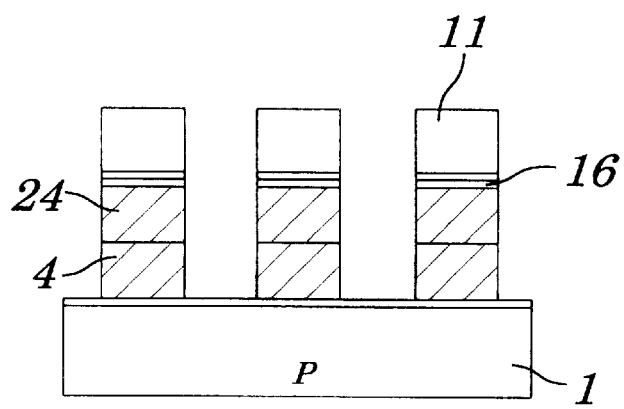

section B-B section C-C section A-A

US 6,373,096 B1

METHOD OF MANUFACTURING SEMICONDUCTOR DEVICE, NONVOLATILE SEMICONDUCTOR MEMORY DEVICE AND METHOD OF MANUFACTURING THE SAME

BACKGROUND OF THE INVENTION

1. Field of the Invention

The present invention relates to a method of manufacturing a semiconductor device, a nonvolatile semiconductor memory device and a method of manufacturing the same, and more particularly to a method of manufacturing a semiconductor device, a nonvolatile semiconductor memory device and a method of manufacturing the same, wherein a buried diffusion layer serves as a signal line.

2. Description of the Related Art

Semiconductor memory devices known as typical semiconductor devices are classified into two types: volatile memories; and, nonvolatile memories. Of these memories, whereas the volatile ones lose their stored data when their power source is turned off, the nonvolatile ones may keep their stored data even when their power source is turned off. The former or volatile memories are known as RAMs (i.e., Random Access Memories), and the latter or nonvolatile memories are known as ROMs (i.e., Read Only Memories).

Of the above-mentioned semiconductor devices, particularly the ROMs are used in various types of information processing apparatuses. Of these ROMs, EPROMs (i.e., Erasable and Programmable ROMs)" and EEP (i.e., Electrically Erasable and Programmable ROMs) are widely known. In the EPROMs, their stored information may be erased by applying ultraviolet rays thereto, and also may be electrically stored therein again. On the other hand, in the EEPs, their stored information may be electrically erased and stored therein again. Further, of the EEPROMs, ones capable of performing information's block erasing and byte writing operations are known as flash memories, which are noted for their abilities to replace the floppy disks and the hard disks both typical of conventional memory means.

Any one of such writable and nonvolatile semiconductor memory devices has an MIS (i.e., Metal Insulator Semiconductor) type construction, in which a metallic gate has a laminated construction and is therefore constructed of: a floating gate buried in an insulation film; and, a control gate formed over this floating gate through the insulation film. In operation, information is stored in a memory cell of the nonvolatile semiconductor memory device by injecting an electric charge into the floating gate of the memory cell which is electrically isolated from the other memory cells in the semiconductor memory device, wherein the floating gate may keep the electric charge thus injected therein even when its power source is turned off.

In such a conventional type of nonvolatile semiconductor memory device and a method of manufacturing the same as those disclosed in Japanese Patent Laid-Open No. Hei 6-283721, for example: buried diffusion layers are formed in a semiconductor region so as to be disposed adjacent to opposite end portions of the floating gate described above, so that the buried diffusion layers are used as bit lines of the semiconductor memory device. FIG. 30 shows a plan view of the above-mentioned conventional type of nonvolatile semiconductor memory device. FIG. 31 shows a cross-sectional view of the conventional nonvolatile semiconductor memory device, taken along the line A—A of FIG. 30. As shown in FIGS. 30 and 31, for example, in an active region defined by a device isolation region or oxide film 52 formed in a P-type semiconductor substrate 51, a first floating gate 54 and a second floating gate 55 are formed side by side and insulated from each other through a gate oxide film 53. Formed in the P-type semiconductor substrate 51 so as to be disposed adjacent to outer end portions of both the first floating gate 54 and the second floating gate 55 are N-type drain regions 56, 57. Further, formed in the P-type semiconductor substrate 51 so as to be disposed between the first floating gate 54 and the second floating gate 55 is an N-type source region 58. A first memory transistor is constructed of the first floating gate 54, N-type drain region 56 and the N-type source region 58. On the other hand, a second memory transistor is constructed of the second floating gate 55, N-type drain region 57 and the N-type source region 58. As is clear from the above, the N-type source region 58 is used in both the first and the second memory transistor.

The first floating gate 54 and the second floating gate 55 are covered with an insulation film 60, which is a so-called "ONO (i.e., Oxide-Nitride-Oxide)" laminated film constructed of, for example, a silicon oxide film, silicon nitride film and a silicon oxide film. Formed over both the first floating gate 54 and the second floating gate 55 through this insulation film 60 is a control gate 61. In general, each of the first floating gate 54, second floating gate 55 and the control gate 61 is made of polysilicon.

In the above-mentioned construction of the nonvolatile semiconductor memory device, as shown in FIG. 30, each of these regions 56, 57 and 58 is constructed of a buried diffusion layer, and serves as a bit line covering a plurality of memory cells of the semiconductor memory device, wherein the memory cells are disposed adjacent to each other. On the other hand, as is clear from FIG. 30, the control gate 61 extends in a direction substantially perpendicular to a longitudinal direction of each of these bit lines 56, 57 and 58 to serve as a word line. Next, with reference to each of FIGS. 32A, 32B, 32C, 33A and 33B, a method of manufacturing the conventional nonvolatile semiconductor memory device will be described in the order of its processing steps.

First, as shown in FIG. 32A, an oxidation-resistant mask film 63 constructed of a silicon nitride film is formed in an active region of a P-type semiconductor substrate 51 through a buffer film 62 of silicon oxide, and then subjected to an oxidation process which is well known as a so-called "LOCOS (i.e., Local Oxidation of Silicon) process", so that a device isolation oxide film 52 serving as a field oxide film is formed.

Then, both the buffer film 62 and the oxidation-resistant mask film 63 are removed. After that, as shown in FIG. 32B, a gate oxide film 53 is formed to cover the active region through a normal oxidation process. Then, by using a CVD (i.e., Chemical Vapor Deposition) process, a first conductive layer 64 made of polysilicon is formed on the entire surface of the semiconductor substrate 51. Here, it will be understood that when a layer or film is referred to as being formed "on" another film or substrate, it can be directly on such another film or substrate, or intervening films may also be present therebetween. Subsequent to the above CVD process, as shown in FIG. 32C, a resist film 65 is formed by using a photolithography process to cover a region in which a floating gate for the first conductive layer 64 should be formed. Under such circumstances, the first conductive layer 64 is subjected to a patterning process, so that the first floating gate 54 and the second floating gate 55 both constructed of the first conductive layer 64 are formed side by side and spaced apart from each other to extend in the same direction. In forming both the first floating gate 54 and the second floating gate 55 through the above-mentioned patterning process of the first conductive layer 64, mask alignment steps in the photolithography process are performed with reference to the device isolation oxide film 52 having been already formed.

After that, an N-type impurity such as arsenic and like impurities is injected into the active region in self-align manner with the use of the first floating gate 54 and the second floating gate 55 both serving as masks. Then, as shown in FIG. 33A, the first floating gate 54 and the second floating gate 55 thus formed are subjected to a heat treatment, so that the N-type drain regions 56, 57 and the N-type source region 58 are formed and used as the buried diffusion layers. When an oxidation process is conducted after completion of the above heat treatment, oxidation of a surface of each of these diffusion layers 56, 57 and 58 which are highly doped with the N-type impurity is enhanced. As a result, as shown in FIG. 33B, an oxide film 66 larger in film thickness than the gate oxide film 53 is formed. Consequently, all the drain region 56, 57 and the source region 58 are covered by the oxide film 66, and therefore buried in the semiconductor substrate 51 to serve as the buried diffusion layers.

Next, as shown in FIG. 33B, by using the CVD process, a floating gate covering insulation film 60 constructed of the ONO (i.e., Oxide-Nitride-Oxide) laminated film is formed to cover both the first floating gate 54 and the second floating gate 55. After that, by using the CVD process, a second conductive layer 67 made of polysilicon is formed on the entire surface of the semiconductor substrate 51, and then patterned to form the control gate 61, so that the nonvolatile semiconductor memory device of the conventional type shown in FIGS. 30 and 31 is produced.

However, the conventional method for manufacturing the nonvolatile semiconductor memory device disclosed in the above-mentioned Japanese Patent Laid-Open No. Hei 6-283721 has the disadvantage that: in forming the floating gates through the patterning operation of the conductive layers, some misalignment occurs with respect to the device isolation oxide film which provides a reference position during the photolithography process. Due to the presence of such misalignment, among the buried diffusion layers disposed adjacent to the outer end portions of the floating gates, a left-hand one differs in width from a right-hand one.

In other words, in the conventional method of manufacturing the nonvolatile semiconductor device shown in FIGS. 32A, 32B, 32C, 33A and 33B, when the first floating gate 54 and the second floating gate 55 are formed by patterning the first conductive layer 64, it is necessary to previously form the resist film 65 on the first conductive layer 64, wherein the resist film 65 serves as the mask. Consequently, a mask alignment operation of this mask on the semiconductor substrate 51 is conducted by using the position of the device isolation oxide film 52 as a reference position of this mask.

However, such mask alignment operation inevitably includes some mechanical misalignment occurring in an optical aligner, and is therefore inadequate in processing accuracy to a today's photolithography technology requiring a very fine processing. In FIG. 32C, due to the presence of the above-mentioned mechanical misalignment occurring in the optical aligner, the resist film 65 is slightly deviated in position to the right or to the left from its designed position. As a result of such deviation in position of the resist film 65, any of the drain regions 56, 57 and the source region 58 varies in width. In other words, these regions 56, 57 and 58 are not equal in width to each other.

Consequently, each of the buried diffusion layers used as the bit lines disposed adjacent to the outer end portions of both the first floating gate 54 and the second floating gate 55 varies in width. Variations in width of these buried layers result in corresponding variations in electric resistance of the buried diffusion layers. Due to the above fact, the conventional nonvolatile semiconductor memory device varies in read current, which often results in errors in reading data. Particularly, in the conventional nonvolatile semiconductor memory device comprising a plurality of memory cells for storing data having multi values, i.e., more particularly, in the conventional nonvolatile semiconductor memory device in which the read currents the number of which is more than three are judged and retrieved as data, even a slight variation in the read current often results in errors in reading data.

On the other hand, FIG. 34 shows another conventional nonvolatile semiconductor memory device in which the buried diffusion layers are disposed adjacent to opposite end portions of a single floating gate. As is clear from FIG. 34, the above-mentioned misalignment also affects in performance such another conventional nonvolatile semiconductor memory device.

SUMMARY OF THE INVENTION

In view of the above, it is an object of the present invention to provide a method of manufacturing a semiconductor, a nonvolatile semiconductor memory device and a method of manufacturing the same, wherein the semiconductor and the nonvolatile semiconductor memory device are free from variations in width of a buried diffusion layer disposed adjacent to each of outer end portions of floating gates, which variations in width of the buried diffusion layer are caused by mechanical misalignment occurring in the optical aligner.

According to a first aspect of the present invention, there is provided a method of manufacturing a semiconductor device provided with a gate electrode and a diffusion layer disposed adjacent to each of opposite end portions of the gate electrode, the method comprising the steps of:

forming a conductive layer on a semiconductor substrate through an insulation film;

patterning the conductive layer to form the gate electrode together with a shielding electrode, wherein the shielding electrode is disposed adjacent to each of opposite end portions of the gate electrode to extend in parallel with the gate electrode;

injecting an impurity into the semiconductor substrate in a self-align manner with the use of both the gate electrode and the shielding electrode as masks to form the diffusion layer covering adjacent ones of transistor cells; and insulating the gate electrode in each of the transistor cells.

According to a second aspect of the present invention, there is provided a nonvolatile semiconductor memory device provided with a plurality of integrated nonvolatile semiconductor memory cells each comprising: a lower floating gate; a control gate formed on the lower floating gate through an insulation film; a diffusion layer disposed adjacent to each of opposite end portions of the lower floating gate, the improvement wherein:

a device isolation shielding electrode is formed outside the diffusion layer disposed adjacent to the opposite end portions of the lower floating gate; and, the device isolation shielding electrode extends in parallel with the lower floating gate to cover adjacent ones of the nonvolatile semiconductor memory cells.

In the foregoing second aspect, a preferable mode is one wherein an upper floating gate larger in area size than the lower floating gate is formed on the lower floating gate.

Also, a preferable mode is one wherein the lower floating gate is constructed of a first floating gate and a second floating gate extending in parallel with the first floating gate; and,
    a common diffusion layer disposed adjacent to an area between the first and the second floating gate so as to be common to both the first and the second floating gate.

Also, a preferable mode is one wherein the lower floating gate is made of a predetermined conductive material, of which the device isolation shielding electrode is also made. In the above nonvolatile semiconductor memory device, preferably, the predetermined conductive material is constructed of polysilicon.

Also, a preferable mode is one wherein the diffusion layer covers adjacent ones of the nonvolatile semiconductor memory cells.

Also, a preferable mode is one wherein the lower floating gate is insulated in each of the nonvolatile semiconductor memory cells.

Also, a preferable mode is one wherein the diffusion layer is constructed of a source region or a drain region of each of the nonvolatile semiconductor memory cells.

Also, a preferable mode is one wherein the device isolation shielding electrode is held at ground potential or at a source potential.

Furthermore, a preferable mode is one wherein the diffusion layer serves as a bit line.

According to a third aspect of the present invention, there is provided a method of manufacturing a nonvolatile semiconductor memory device provided with a plurality of integrated nonvolatile semiconductor memory cells each comprising: a lower floating gate; a control gate formed on the lower floating gate through an insulation film; a diffusion layer disposed adjacent to each of opposite end portions of the lower floating gate, the method comprising the steps of:
    forming a first conductive layer on a semiconductor substrate through an insulation film;
    patterning the first conductive layer to form the lower floating gate together with a device isolation shielding electrode, wherein the shielding electrode is disposed adjacent to each of opposite end portions of the gate electrode to extend in parallel with the lower floating gate; and
    injecting an impurity into the semiconductor substrate in a self-align manner with the use of both the lower floating gate and the device isolation shielding electrode as masks to form the diffusion layer.

In the foregoing third aspect, it is preferable that in the step of patterning the first conductive layer to form the lower floating gate together with the device isolation shielding electrode, a first floating gate and a second floating gate extending in parallel with the first floating gate are formed.

Also, it is preferable that in the step of injecting the impurity into the semiconductor substrate in a self-align manner with the use of both the lower floating gate and the device isolation shielding electrode as the masks to form the diffusion layer, the diffusion layer is so formed as to cover adjacent ones of the nonvolatile semiconductor memory cells.

Also, a preferable mode is one that wherein further comprises the steps of:
    forming a floating gate covering insulation film for covering the lower floating gate, wherein the steps of forming the floating gate covering insulation film follows the step of injecting the impurity into the semiconductor substrate in the self-align manner with the use of both the lower floating gate and the device isolation shielding electrode as the masks to form the diffusion layer;
    forming a second conductive layer for covering the floating gate covering insulation layer;
    patterning the second conductive layer to form the control gate extending in a direction substantially perpendicular to a longitudinal direction of each of the lower floating gate and the device isolation shielding electrode; and
    patterning the lower floating gate in a self-align manner with the use of the control gate as a mask to have only a portion of the lower floating gate immediately under the control gate remain.

Also, a preferable mode is one wherein the step of patterning the second conductive layer is performed by:
    covering the second conductive layer with a second conductive layer covering insulation film;
    patterning the second conductive layer covering insulation film to form a mask insulation film; and
    using the mask insulation film as a mask.

Also, a preferable mode is one wherein the step of patterning the lower floating gate is performed by using both a resist film and the mask insulation film as masks in a self-align manner in a condition in which the device isolation shielding electrode is covered with the resist film.

Also, a preferable mode is one that wherein further comprises the step of forming a third conductive layer by:
    covering the lower floating gate with a third conductive layer before the step of forming the floating gate covering insulation film is performed; and
    patterning the third conductive layer in a manner such that the third conductive layer is larger in area size than the lower floating gate, so that an upper floating gate is formed.

Also, a preferable mode is one wherein each of the first, second and the third conductive layer is made of polysilicon.

With the above configurations, the lower floating gate is simultaneously formed together with the device isolation shielding electrodes disposed adjacent to the opposite end portions of the lower floating gate, wherein the device isolation shielding electrodes extend in parallel with the lower floating gate. Consequently, in the present invention, there is no fear that a left-hand and a right-hand regions both to be formed into the diffusion layers differ in width from each other even when some misalignment occurs as to the resist patterning mask which is used to form the lower floating gate with reference in position to the device isolation oxide film. This is because the lower floating gate is formed simultaneously with formation of the device isolation shielding electrodes disposed adjacent to the opposite end portions of the lower floating gate, wherein the device isolation shielding electrodes extend in parallel with the lower floating gate.

As a result, it is possible for the present invention to eliminate any variations in width of the buried diffusion layers disposed adjacent to the opposite end portions of the lower floating gate, wherein the variations in width are caused by misalignment occurring in the optical aligner.

BRIEF DESCRIPTION OF THE DRAWINGS

The above and other objects, advantages and features of the present invention will be more apparent from the following description taken in conjunction with the accompanying drawings in which:

FIGS. 6A, 6B and 6C show a series of processing steps of the method of manufacturing the first embodiment of the nonvolatile semiconductor memory device of the present invention, wherein: FIGS. 6A, 6B and 6C are cross-sectional views of the semiconductor substrate of the first embodiment of the nonvolatile semiconductor memory device of the present invention, corresponding to FIGS. 2, 3 and 4, respectively;

FIGS. 7A, 7B and 7C show a series of processing steps of the method of manufacturing the first embodiment of the nonvolatile semiconductor memory device of the present invention, wherein: FIGS. 7A, 7B and 7C are cross-sectional views of the semiconductor substrate of the first embodiment of the nonvolatile semiconductor memory device of the present invention, corresponding to FIGS. 2, 3 and 4, respectively;

FIGS. 8A, 8B and 8C show a series of processing steps of the method of manufacturing the first embodiment of the nonvolatile semiconductor memory device of the present invention, wherein: FIGS. 8A, 8B and 8C are cross-sectional views of the semiconductor substrate of the first embodiment of the nonvolatile semiconductor memory device of the present invention, corresponding to FIGS. 2, 3 and 4, respectively;

FIGS. 9A, 9B and 9C show a series of processing steps of the method of manufacturing the first embodiment of the nonvolatile semiconductor memory device of the present invention, wherein: FIGS. 9A, 9B and 9C are cross-sectional views of the semiconductor substrate of the first embodiment of the nonvolatile semiconductor memory device of the present invention, corresponding to FIGS. 2, 3 and 4, respectively;

FIGS. 10A, 10B and 10C show a series of processing steps of the method of manufacturing the first embodiment of the nonvolatile semiconductor memory device of the present invention, wherein: FIGS. 10A, 10B and 10C are cross-sectional views of the semiconductor substrate of the first embodiment of the nonvolatile semiconductor memory device of the present invention, corresponding to FIGS. 2, 3 and 4, respectively;

FIGS. 11A, 11B and 11C show a series of processing steps of the method of manufacturing the first embodiment of the nonvolatile semiconductor memory device of the present invention, wherein: FIGS. 11A, 11B and 11C are cross-sectional views of the semiconductor substrate of the first embodiment of the nonvolatile semiconductor memory device of the present invention, corresponding to FIGS. 2, 3 and 4, respectively;

FIGS. 12A, 12B and 12C show a series of processing steps of the method of manufacturing the first embodiment of the nonvolatile semiconductor memory device of the present invention, wherein: FIGS. 12A, 12B and 12C are cross-sectional views of the semiconductor substrate of the first embodiment of the nonvolatile semiconductor memory device of the present invention, corresponding to FIGS. 2, 3 and 4, respectively;

FIGS. 18A, 18B and 18C show a series of processing steps of the method of manufacturing the second embodiment of the nonvolatile semiconductor memory device of the present invention, wherein: FIGS. 18A, 18B and 18C are cross-sectional views of the semiconductor substrate of the second embodiment of the nonvolatile semiconductor memory device of the present invention, corresponding to FIGS. 2, 3 and 4, respectively;

FIGS. 19A, 19B and 19C show a series of processing steps of the method of manufacturing the second embodiment of the nonvolatile semiconductor memory device of the present invention, wherein: FIGS. 19A, 19B and 19C are cross-sectional views of the semiconductor substrate of the second embodiment of the nonvolatile semiconductor memory device of the present invention, corresponding to FIGS. 2, 3 and 4, respectively;

FIGS. 20A, 20B and 20C show a series of processing steps of the method of manufacturing the second embodiment of the nonvolatile semiconductor memory device of the present invention, wherein: FIGS. 20A, 20B and 20C are cross-sectional views of the semiconductor substrate of the second embodiment of the nonvolatile semiconductor memory device of the present invention, corresponding to FIGS. 2, 3 and 4, respectively;

DETAILED DESCRIPTION OF THE PREFERRED EMBODIMENTS

Figure 1:
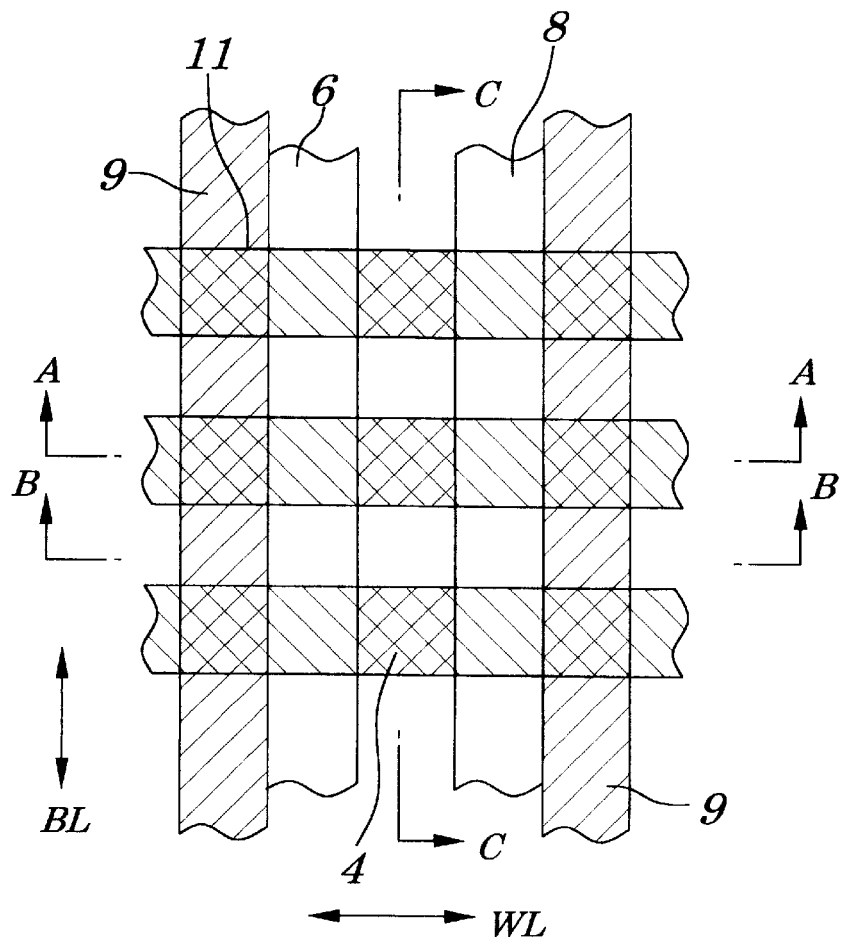
FIG. 1 is a plan view of a first embodiment of the nonvolatile semiconductor memory device of the present invention.
Figure 2:
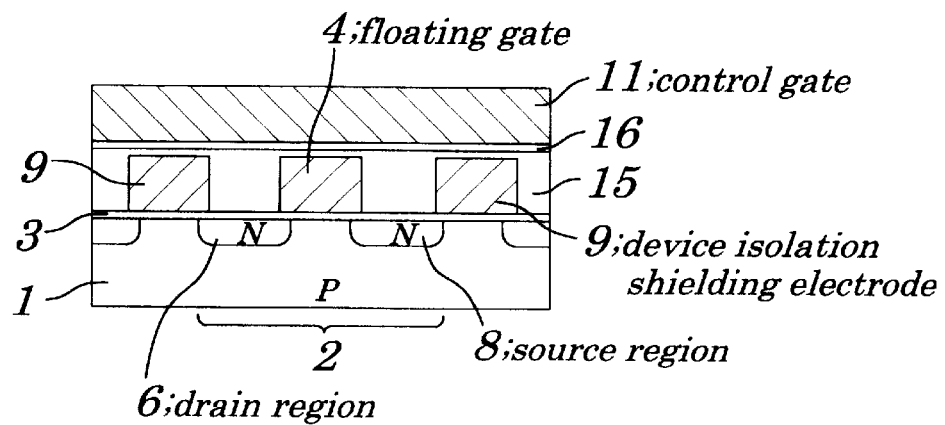
FIG. 2 is a cross-sectional view of the first embodiment of the nonvolatile semiconductor memory device of the present invention, taken along the line A—A of FIG. 1.
Figure 3:
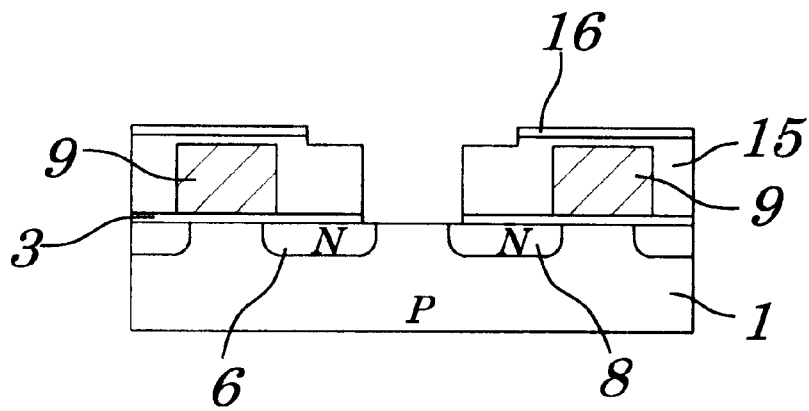
FIG. 3 is a cross-sectional view of the first embodiment of the nonvolatile semiconductor memory device of the present invention, taken along the line B—B of FIG. 1.
Figure 4:
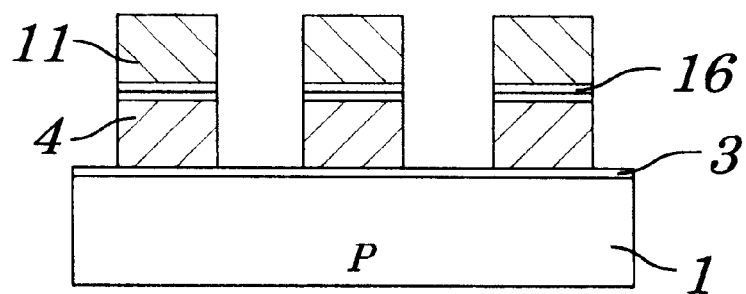
FIG. 4 is a cross-sectional view of the first embodiment of the nonvolatile semiconductor memory device of the present invention, taken along the line C—C of FIG. 1.

The best modes for carrying out the present invention will be described in detail using embodiments of the present invention with reference to the accompanying drawings.

The present invention may, however, be embodied in various different forms and should not be construed as limited to the embodiments set forth herein; rather, these embodiments are provided so that this disclosure will be thorough and complete, and will fully convey the scope of the present invention to those skilled in the art.

In the accompanying drawings, the thickness of films and regions are exaggerated for clarity. Like reference numerals refer to like parts throughout the drawings.

Incidentally, it will also be understood that when a layer or film is referred to as being "on" another film or substrate, it can be directly on such another film or substrate, or intervening films may also be present therebetween.

First Embodiment

FIGS. 1 to 12C show a first embodiment of a nonvolatile semiconductor memory device of the present invention. Of these drawings, FIGS. 6A to 12C show a method of manufacturing the nonvolatile semiconductor memory device of the present invention.

As shown in FIGS. 1 to 5, in the first embodiment of the nonvolatile semiconductor memory device of the present invention, for example: a lower floating gate 4 is formed in an active region 2 of a P-type semiconductor substrate 1 through a gate oxide film 3; and, an N-type drain region 6 and an N-type source region 8 are disposed adjacent to opposite end portions of the lower floating gate 4 through the gate oxide film 3. Further, disposed outside both the N-type drain region 6 and the N-type source region 8 are a pair of device isolation shielding electrodes 9, wherein the device isolation shielding electrodes 9 extend in parallel with the lower floating gate 4 to cover adjacent ones of memory cells. These device isolation shielding electrodes 9 define the width of the active region 2. Any of the lower floating gate 4, drain region 6, source region 8, and the device isolation shielding electrode 9 extends in a longitudinal direction of the bit line BL.

The lower floating gate 4 is covered with a floating gate covering insulation film 16 which is constructed of a suitable film, for example such as the ONO (i.e., Oxide-Nitride-Oxide)" laminated film and the like. Through this insulation film 16, the control gate 11 is formed on the lower floating gate 4 to extend in a direction substantially perpendicular to the longitudinal direction of the bit line BL. For example, the lower floating gate 4, device isolation shielding electrode 9 and the control gate 11 are made of polysilicon. Here, the lower floating gate 4 is disposed in a position only immediately under the control gate 11 of each of memory cells of the nonvolatile semiconductor memory device of the present invention, and insulated in each of the memory cells.

In the first embodiment of the nonvolatile semiconductor memory device of the present invention having the above construction, both the drain region 6 and the source region 8 are constructed of the buried diffusion layers cover adjacent ones of the memory cells, wherein: the drain region 6 is used as the bit line BL; and, the control gate 11 extends in a direction substantially perpendicular to the longitudinal direction of each of the regions 6, 8 to serve as a word line WL. On the other hand, the device isolation shielding electrode 9 described above is held at ground potential or a source potential.

Now, with reference to FIGS. 6A to 12C, a method of manufacturing the nonvolatile semiconductor memory device of the present invention will be described in the order of its processing steps. Incidentally, in FIGS. 6A to 12C, the suffixes "A", "B" and "C" appearing in the titles of the individual views of the drawings denote the cross-sectional views of the semiconductor memory devices, taken along the line A—A, B—B and C—C of FIG. 1, respectively.

Figure 6A:
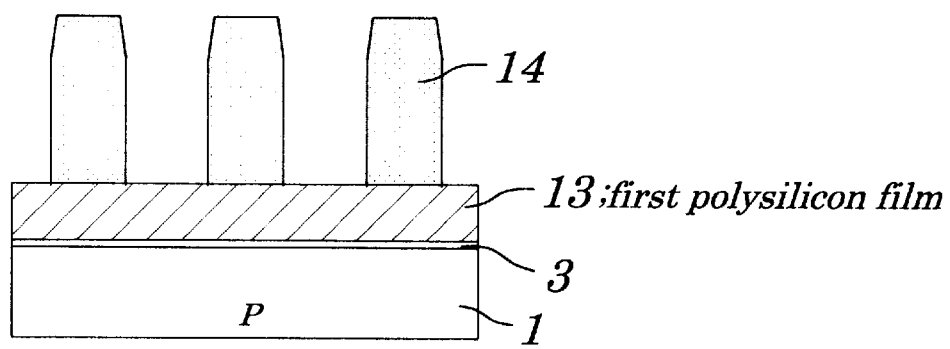
Figure 6B:
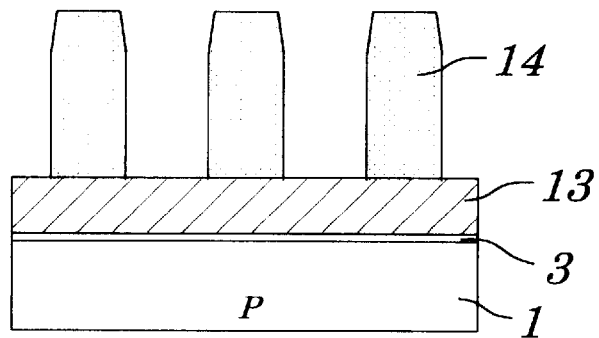
Figure 6C:
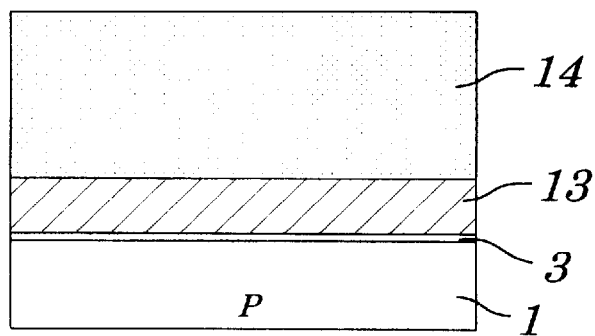

First, as shown in FIGS. 6A, 6B and 6C, a gate oxide film 3 having a film thickness of 8 to 15 nm is formed on the entire surface of the P-type semiconductor substrate 1 through a thermal oxidation process. After that, by using the CVD process, a first polysilicon film 13 having a film thickness of from 100 to 200 nm is formed on the gate oxide film 3. Then, by using a photolithography process, predetermined portions of the first polysilicon film 13 are covered with a resist film 14, wherein the predetermined portions are formed into the lower floating gate 4 and the device isolation shielding electrode 9.

After that, the first polysilicon film 13 is patterned by etching with the use of the resist film 14 as a mask, so that all the lower floating gate 4 and the device isolation shielding electrode 9 are simultaneously formed, wherein the device isolation shielding electrode 9 extends in parallel with the lower floating gate 4, and, therefore extends along the bit line BL. As described above, by simultaneously patterning and forming the lower floating gate 4 and the device isolation shielding electrode 9 which corresponds to the conventional device isolation oxide film 52, there is no fear that the left-hand diffusion layer differs in width from the right-hand diffusion layer, wherein the difference in width between the left-hand and the right-hand diffusion layer is resulted from misalignment occurring in aligning the mask used in resist patterning for forming the lower floating gate 4 with reference to a reference position provided by the device isolation oxide film 52.

Then, an N-type impurity, for example such as arsenic ions is injected into the P-type semiconductor substrate 1 in a self-align manner with the use of the lower floating gate 4 and the device isolation shielding electrode 9 as masks.

Figure 8A:
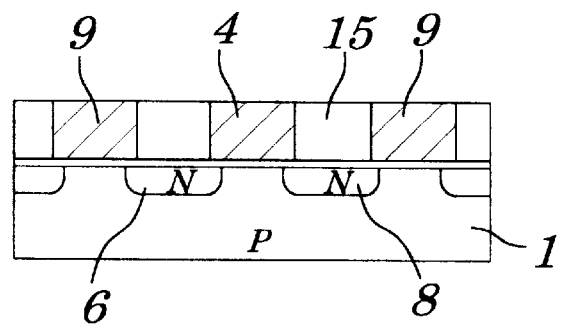
Figure 8B:
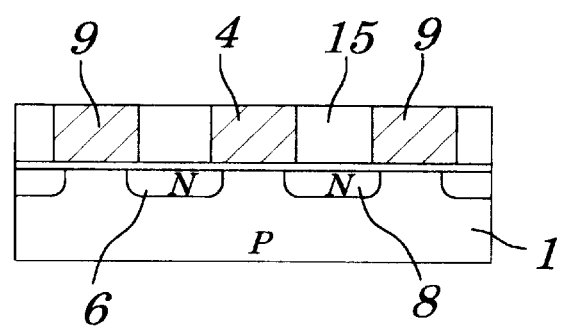
Figure 8C:
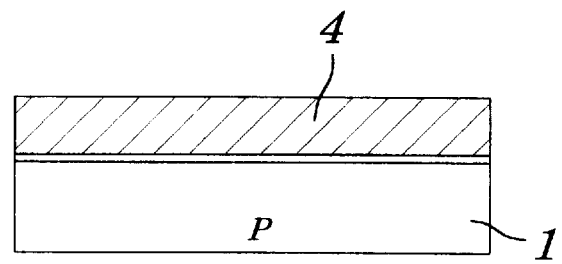

After that, as shown in FIGS. 8A, 8B and 8C, the P-type semiconductor substrate 1 is subjected to a heat treatment to have the thus injected arsenic ions diffused in the semiconductor substrate 1 to form the N-type drain region 6 and the N-type source region 8.

As described above, by forming both the drain region 6 and the source region 8 in the buried diffusion layers in a self-align manner with the use of the device isolation shielding electrode 9 and the lower floating gate 4 both simultaneously formed, it is possible to form the buried diffusion layer in each of the opposite end portions of the lower floating gate 4, wherein the left-hand buried diffusion layer is substantially equal in width to the right-hand buried diffusion layer. Consequently, in contrast with the prior art, in the present invention, there is no difference in width of the buried diffusion layers disposed adjacent to the opposite end portions of the lower floating gate 4. Therefore, there is no variations in resistance of the buried diffusion layers, which improves the various characteristic of the nonvolatile semiconductor memory device of the present invention, wherein these characteristics such as read characteristics are heretofore affected by variations in resistance of the buried diffusion layers.

Now, by using the CVD process, a silicon oxide film 15 is formed on the entire surface of the semiconductor substrate 1. After that, by using an etch back process or a CMP (i.e., Chemical Mechanical Polishing) process, unnecessary portions of the silicon oxide film 15 are removed, so that a surface of the silicon oxide film 15 is flattened.

Figure 9A:
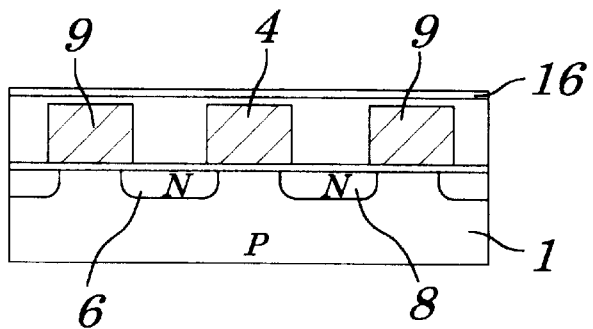
Figure 9B:
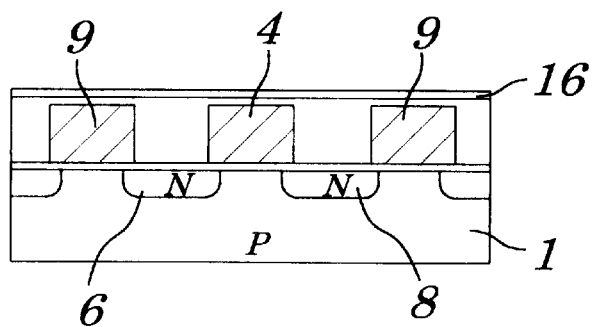
Figure 9C:
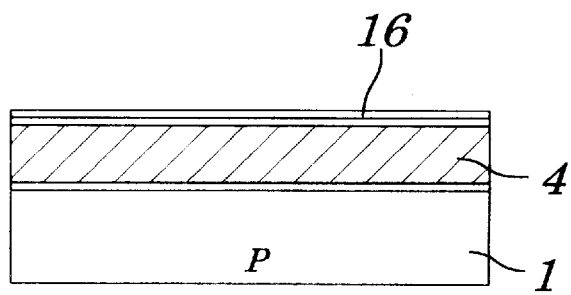

After that, as shown in FIGS. 9A, 9B and 9C, by using the CVD process, the floating gate covering insulation film 16 is formed on the entire surface of the semiconductor substrate 1 to cover both the lower floating gate 4 and the device isolation shielding electrode 9, wherein the floating gate covering insulation film 16 is constructed of the ONO film in which a silicon oxide film having a film thickness of approximately 8 nm, silicon nitride film having a film thickness of approximately 8 nm and a silicon oxide film having a film thickness of approximately 8 nm are stacked together in this order to form the ONO film.

Figure 10A:
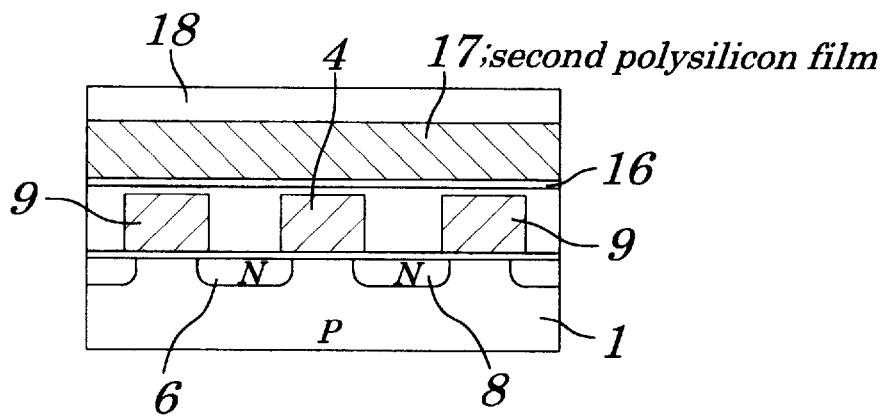
Figure 10B:
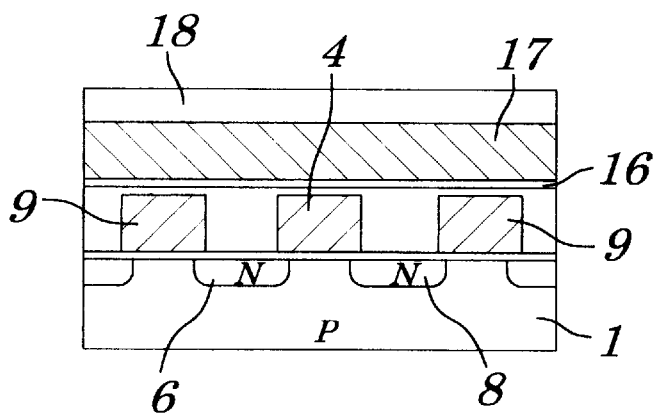
Figure 10C:
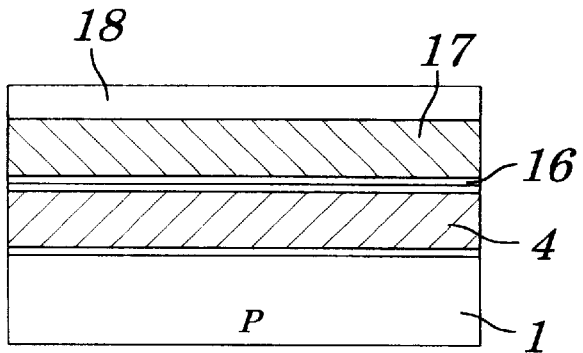

Then, as shown in FIGS. 10A, 10B and 10C, by using the CVD process, a second polysilicon film 17 having a film thickness of from 100 to 200 nm is formed on the entire surface of the floating gate covering insulation film 16. After that, by using the CVD process, a silicon oxide film 18 having a film thickness of from 50 to 150 nm is formed on the entire surface of the second polysilicon film 17.

Figure 11A:
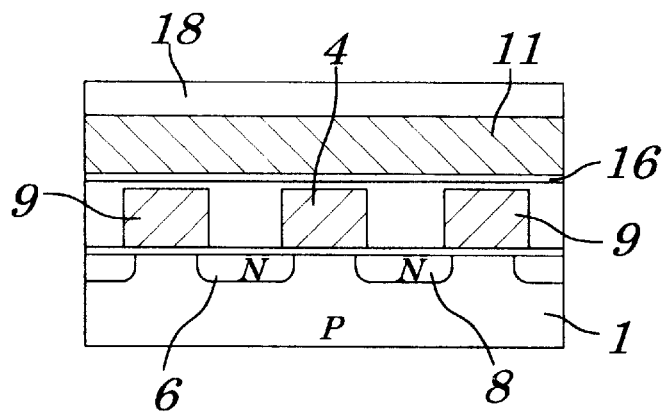
Figure 11B:
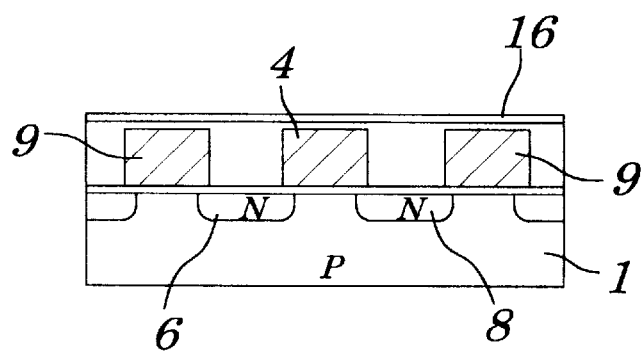
Figure 11C:
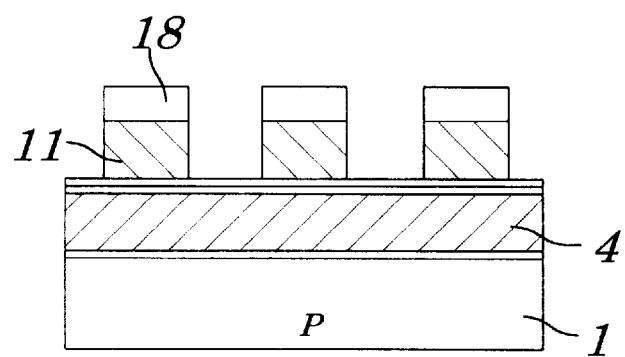

After that, by using the photolithography process, predetermined portions of the silicon oxide film 18 are covered with a resist film (not shown), wherein the predetermined portions of the silicon oxide film 18 correspond to the control gate 11 (formed later) in contour. Then, as shown in FIGS. 11A, 11B and 11C, the control gate 11 is formed to extend along the word line WL. Formation of the control gate 11 is performed by patterning both the silicon oxide film 18 and the second polysilicon film 17 with the use of the resist film (not shown) serving as an etching mask. At this time, in the construction shown the cross-sectional view in FIG. 11B, no control gate is formed. Consequently, the second polysilicon film 17 is removed.

Figure 12A:
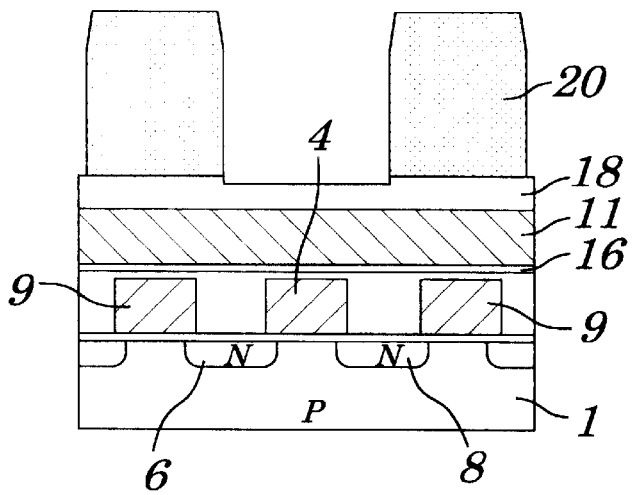
Figure 12B:
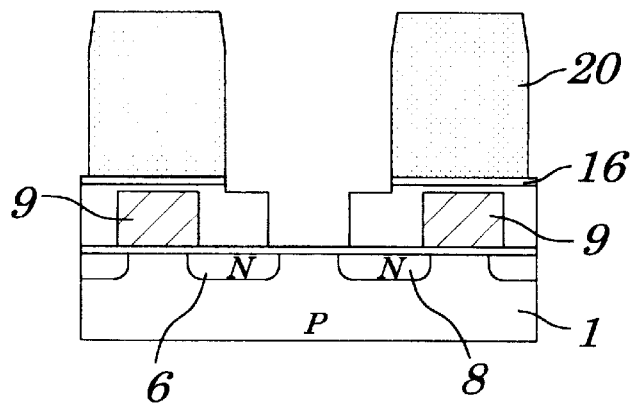
Figure 12C:
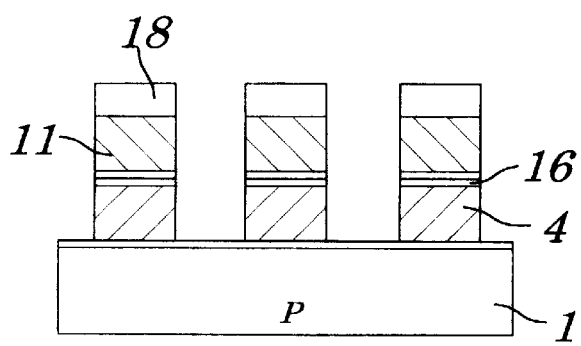

Next, as shown in FIGS. 12A, 12B and 12C, a resist film 20 is formed over the device isolation shielding electrode 9. After that, the silicon oxide film 18 covered with the resist film 20 is subjected to an etching process in a self-align manner with the use of the silicon oxide film 18 as a mask, so that the lower floating gate 4 extending along the bit line BL is patterned, and thereby permitting the lower floating gate 4 disposed immediately under the control gate 11 to remain. Due to this, the lower floating gate 4 is insulated together with its corresponding memory cell from adjacent ones of the other memory cells. In other words, at this time, as shown in FIG. 12B showing the cross-sectional view of the semiconductor substrate 1, the lower floating gate 4 has been removed by etching, and, therefore any lower floating gate does not exist.

Figure 5:
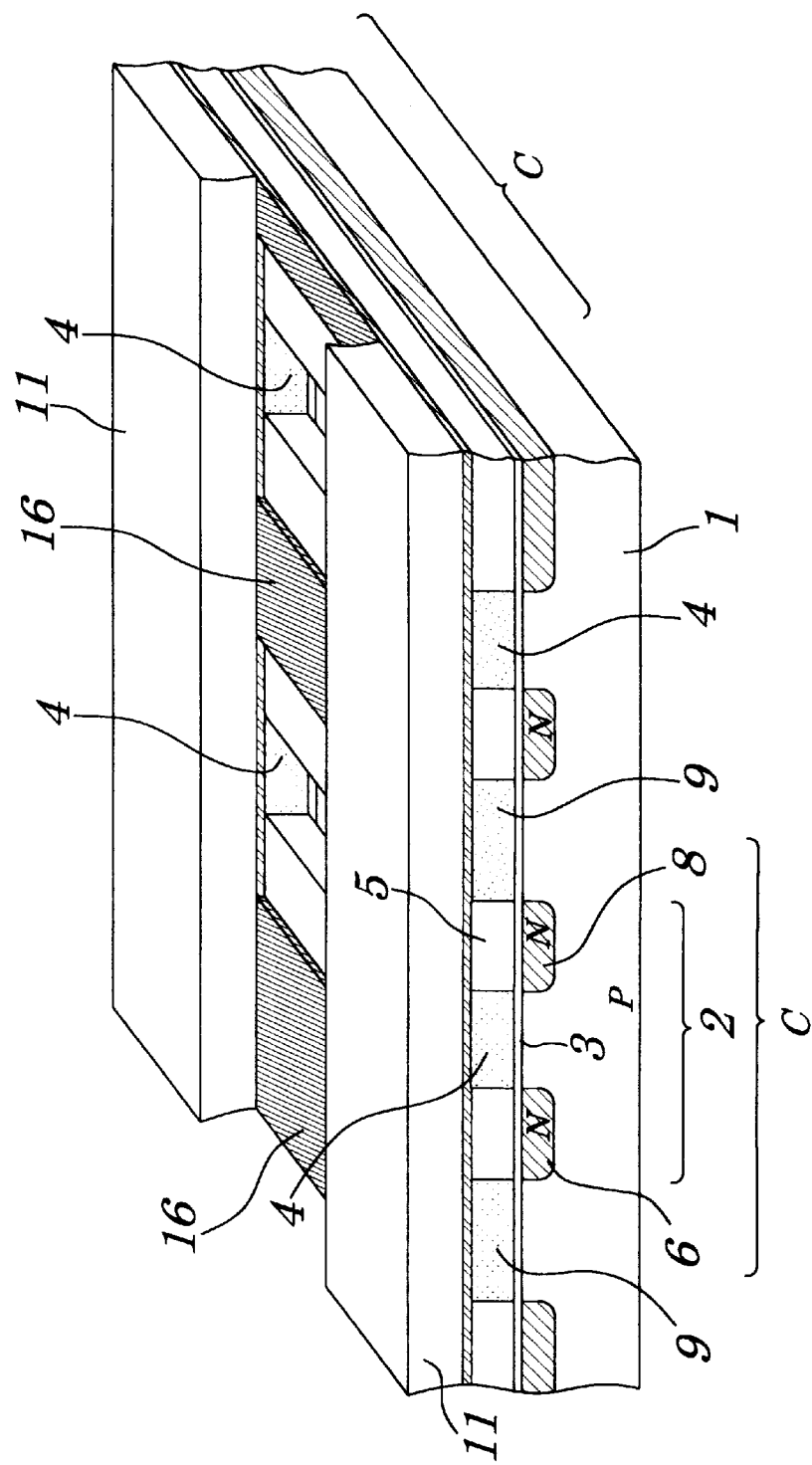
FIG. 5 is a perspective view of the first embodiment of the nonvolatile semiconductor memory device of the present invention shown in FIG. 1.
Figure 30:
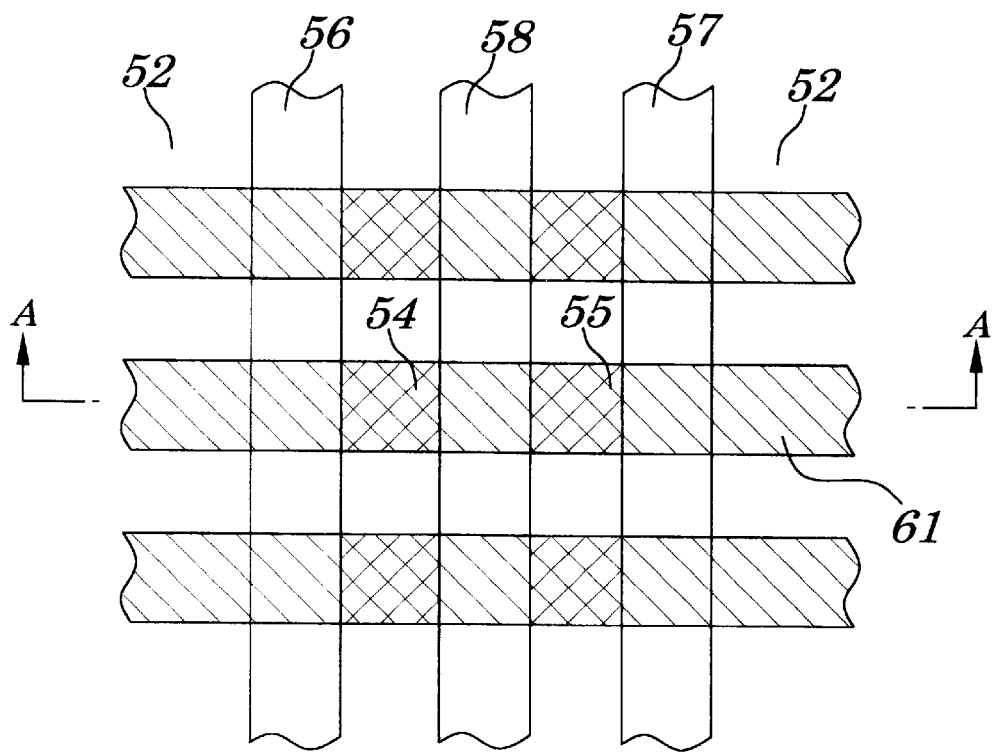
FIG. 30 is a plan view of the nonvolatile semiconductor memory device of the prior art.
Figure 31:
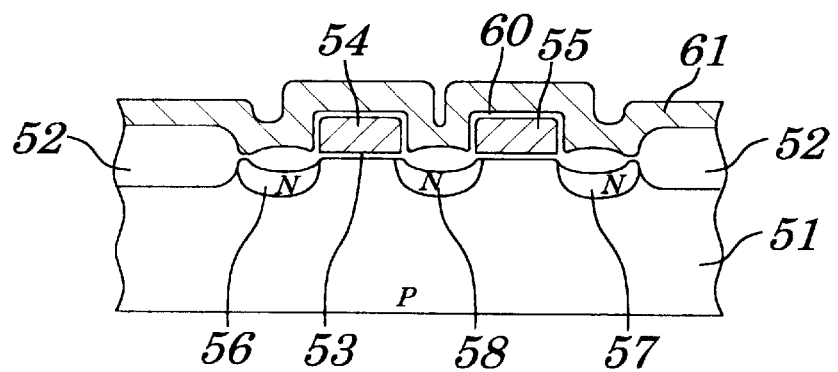
FIG. 31 is a cross-sectional view of the conventional nonvolatile semiconductor memory device, taken along the line A—A of FIG. 30.
Figure 32A:
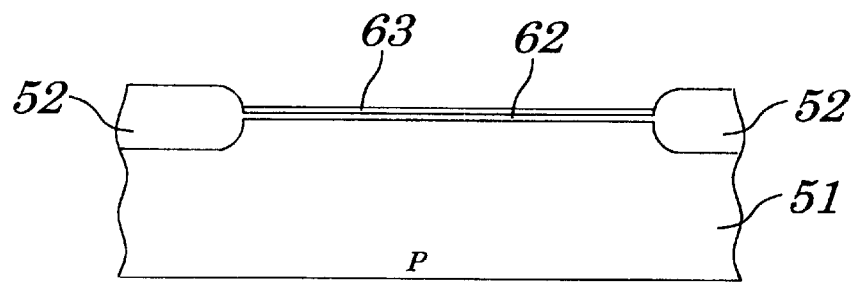
FIGS. 32A, 32B and 32C are a series of cross-sectional views of the conventional nonvolatile semiconductor memory device, illustrating the order of the processing steps of the conventional method of manufacturing the conventional nonvolatile semiconductor memory device.
Figure 32B:
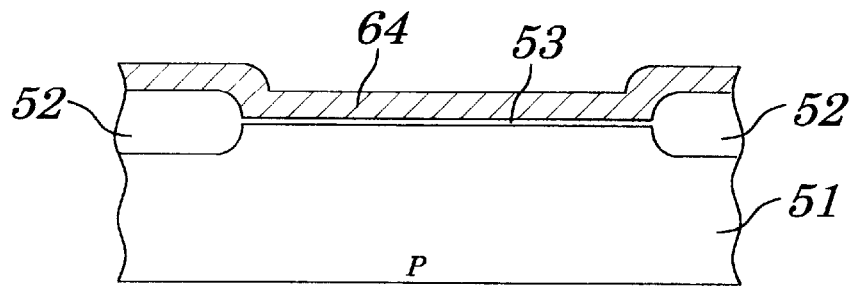
Figure 32C:
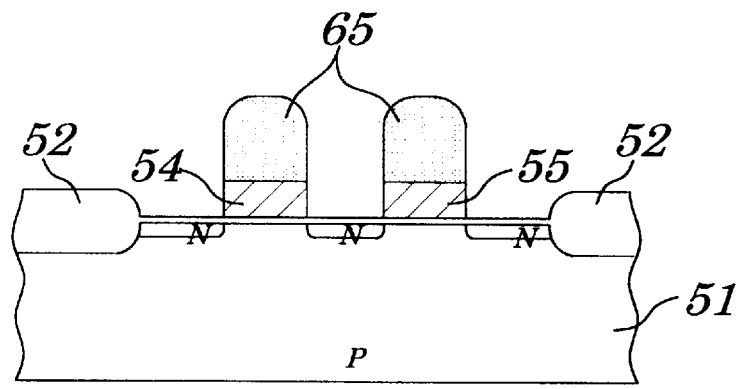
Figure 33A:
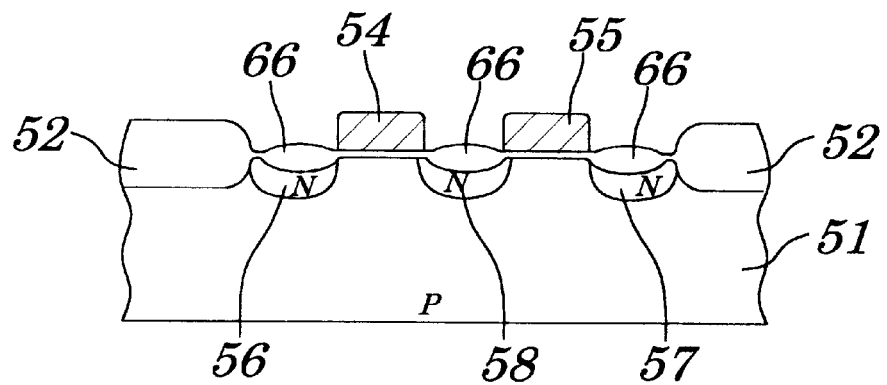
FIGS. 33A and 33B are a series of cross-sectional views of the conventional nonvolatile semiconductor memory device, illustrating the order of processing steps of the conventional method of manufacturing the conventional nonvolatile semiconductor memory device.
Figure 33B:
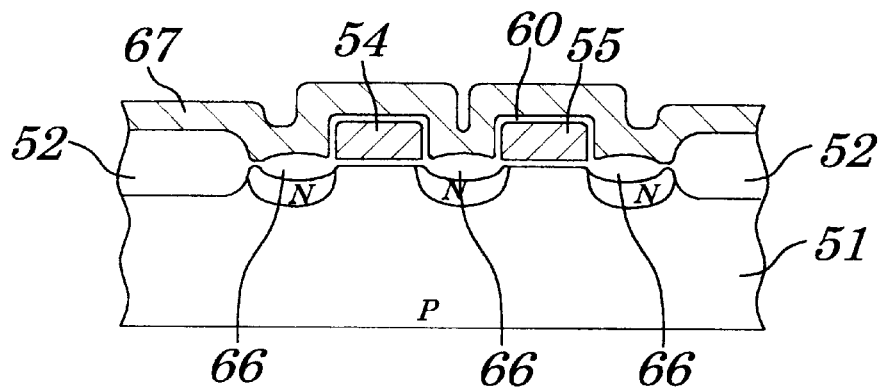
Figure 34:
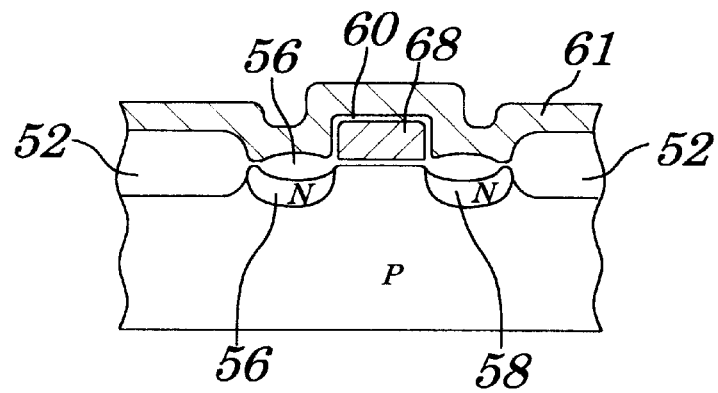
FIG. 34 is a cross-sectional view of the conventional nonvolatile semiconductor memory device, illustrating the structure of the memory device.

Next, by removing the resist film 20, it is possible to complete the first embodiment of the nonvolatile semiconductor memory device of the present invention. Incidentally, the first embodiment of the nonvolatile semiconductor memory device of the present invention shown in FIG. 5 is different in construction from the conventional nonvolatile semiconductor memory device shown in FIGS. 30 and 31. In other words, in the nonvolatile semiconductor memory device of the present invention shown in FIG. 5, an area between the adjacent ones of the lower floating gates 4 is not covered with the control gate 11 in construction. Further, in FIG. 5, the reference letter "C" denotes a single memory cell. For example, the memory cell C has an area of 0.96×0.44 $\mu$m.

As described above, in the first embodiment of the present invention having the above construction, since the lower floating gate 4 and the device isolation shielding electrode 9, which is disposed in each of the opposite end portions of the lower floating gate 4 to extend in parallel with the lower floating gate 4, are simultaneously formed, there is no fear that the left-hand diffusion layer differs in width from the right-hand diffusion layer even when misalignment occurs in aligning a resist pattern forming mask for forming the lower floating gate 4 with the device isolation oxide film serving as a reference position.

Consequently, it is possible for the present invention to remove the variations in width of the diffusion layer disposed in each of the opposite end portions of the lower floating gate 4, wherein the variations in width are caused by the misalignment described above.

Second Embodiment

Figure 13:
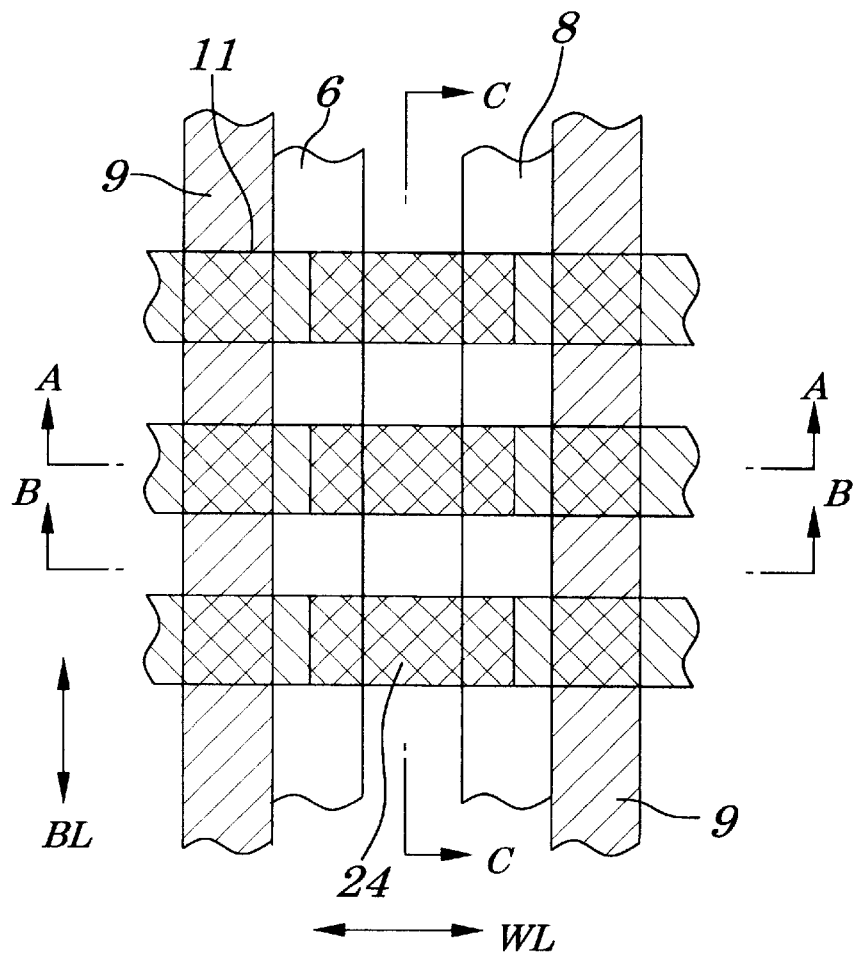
FIG. 13 is a plan view of a second embodiment of the nonvolatile semiconductor memory device of the present invention.
Figure 14:
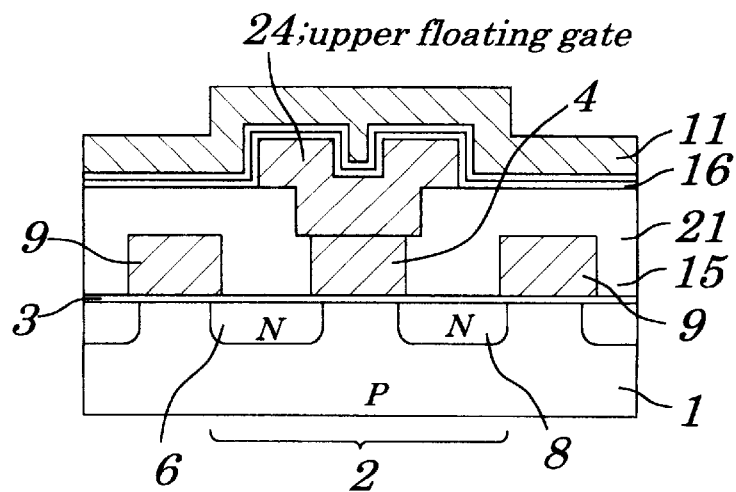
FIG. 14 is a cross-sectional view of the second embodiment of the nonvolatile semiconductor memory device of the present invention, taken along the line A—A of FIG. 13.
Figure 15:
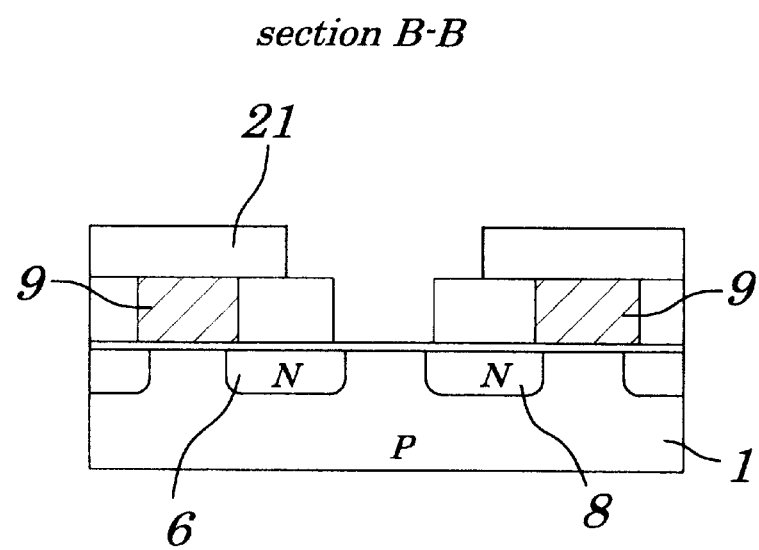
FIG. 15 is a cross-sectional view of the second embodiment of the nonvolatile semiconductor memory device of the present invention, taken along the line B—B of FIG. 13.
Figure 16:
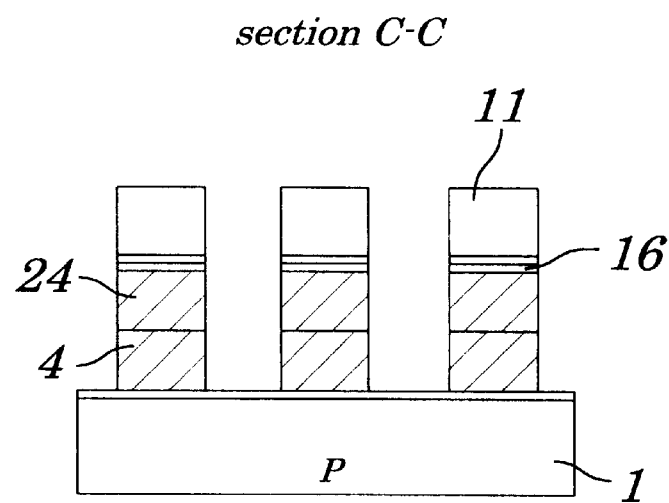
FIG. 16 is a cross-sectional view of the second embodiment of the nonvolatile semiconductor memory device of the present invention, taken along the line C—C of FIG. 13.
Figure 17:
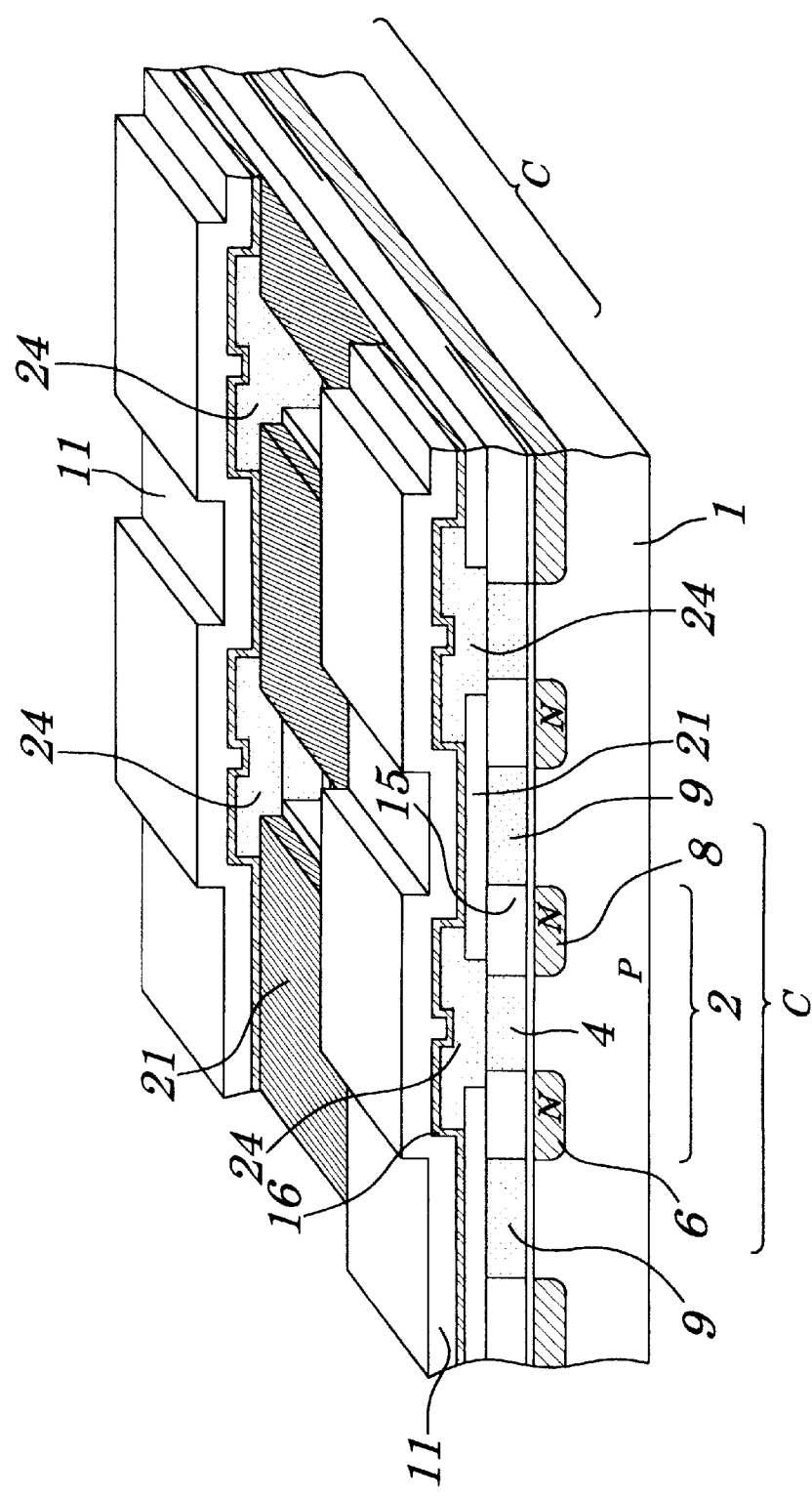
FIG. 17 is a perspective view of the second embodiment of the nonvolatile semiconductor memory device of the present invention shown in FIG. 13.

FIG. 13 shows a second embodiment of the nonvolatile semiconductor memory device of the present invention. In FIGS. 18A to 20C, the suffixes "A", "B" and "C" appearing in the titles of the individual views of the drawings denote the cross-sectional views of the semiconductor memory devices, taken along the line A—A, B—B and C—C of FIG. 13, respectively.

The second embodiment of the nonvolatile semiconductor memory device of the present invention is substantially similar to the first embodiment of the nonvolatile semiconductor memory device of the present invention, except that: the second embodiment of the nonvolatile semiconductor memory device of the present invention is provided with an upper floating gate 24 disposed on the lower floating gate 4.

As shown in FIGS. 13 to 17, in second embodiment of the nonvolatile semiconductor memory device of the present invention, the upper floating gate 24 larger in area size than the lower floating gate 4 is disposed on the lower floating gate 4. For example, the upper floating gate 24 is constructed of a polysilicon film as is in the lower floating gate 4.

As described above, by disposing the upper floating gate 24 larger in area size than the lower floating gate 4 on the lower floating gate 4 which is oppositely disposed from the control gate 11 through the floating gate covering insulation film 16, it is possible for the lower floating gate 4 to increase in effect its surface area oppositely disposed from the control gate 11. Consequently, it is also possible to increase a capacitance between the lower floating gate 4 and the control gate 11. Potential of the lower floating gate 4 is depending on the capacitance between the lower floating gate 4 and the control gate 11 and a capacitance between the lower floating gate 4 and the semiconductor substrate 1. Consequently, it is possible to increase in potential the lower floating gate 4 by increasing the capacitance between the control gate 11 and the lower floating gate 4. As a result, in the second embodiment of the nonvolatile semiconductor memory device of the present invention having the above construction, it is possible to decrease a voltage applied to the control gate 11, which permits a write voltage to be decreased.

Since the second embodiment of the nonvolatile semiconductor memory device of the present invention is substantially similar to the first embodiment of the nonvolatile semiconductor memory device of the present invention except the above difference in construction, in FIGS. 13 to 17, the same reference numerals and letters are used as in FIGS. 1 to 5 to denote like parts which will be not described again to avoid redundancy in description.

Now, with reference to FIGS. 18A to 20C, a method of manufacturing the second embodiment of the nonvolatile semiconductor memory device of the present invention will be described in the order of its process steps.

Figure 18A:
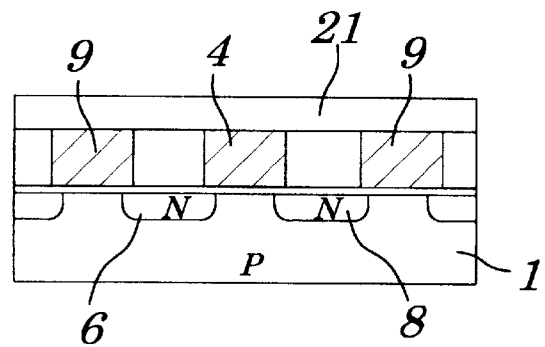
Figure 18B:
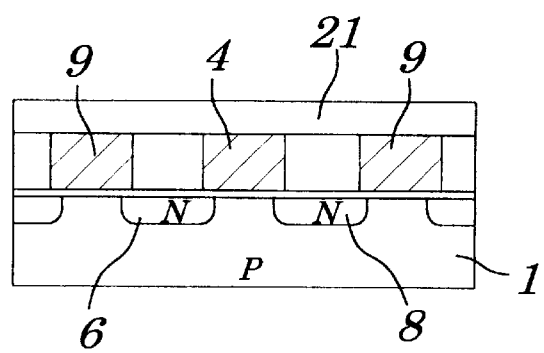
Figure 18C:
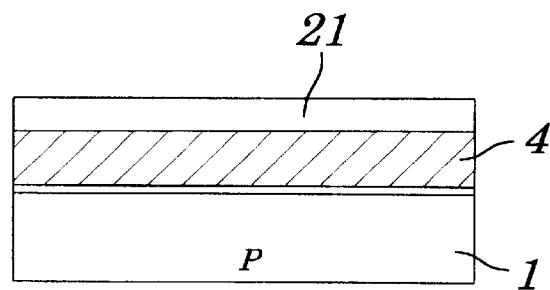

In the method of manufacturing the second embodiment of the nonvolatile semiconductor memory device of the present invention, substantially the same process steps as those shown in FIGS. 6A to 8C are performed. After that, as shown in FIGS. 18A, 18B and 18C, by using the CVD process, a silicon oxide film 21 having a film thickness of from 50 to 150 nm is formed on the entire surface of the semiconductor substrate 1.

Figure 19A:
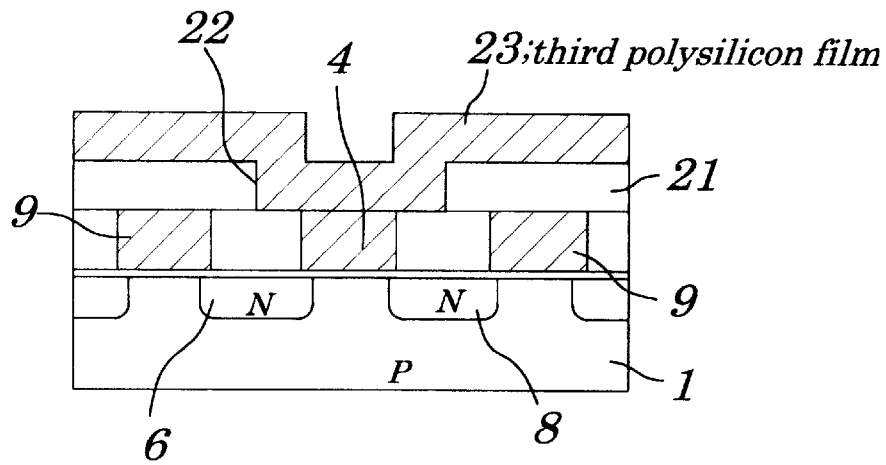
Figure 19B:
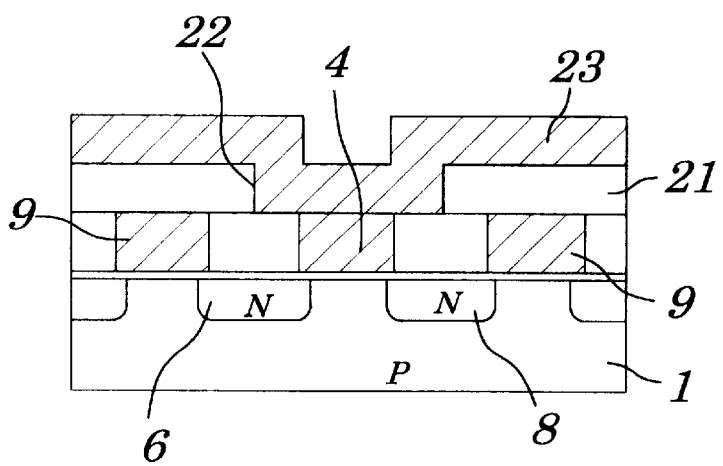
Figure 19C:
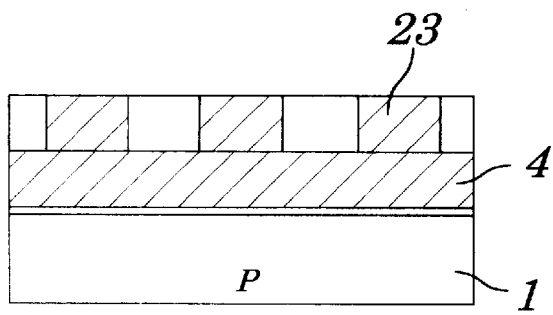

Then, as shown in FIGS. 19A, 19B and 19C, by using the photolithography process, a contact window 22 is formed by removing a predetermined portion of the silicon oxide film 21, wherein the predetermined portion is located on and in the vicinity of the lower floating gate 4. After that, by using the CVD process, a third polysilicon film 23 having a film thickness of from 100 to 200 nm is formed on the entire surface of the semiconductor substrate including the contact window 22.

Next, as shown in FIGS. 20A, 20B and 20C, by using a photolithography process, an unnecessary portion of the third polysilicon film 23 is removed, so that the upper floating gate 24 is formed on the lower floating gate 4, wherein the upper floating gate 24 is larger in area size than the lower floating gate 4. As a result, a surface area size of the lower floating gate 4 increases to be in effect equivalent to the surface area size of the upper floating gate 24, and thereby having its surface area facing the control gate 11 (which is formed in a processing step subsequent to this step) increase.

Then, by using the CVD process, the floating gate covering insulation film 16 constructed of the ONO film is formed so that the upper floating gate 24 is covered with this floating gate covering insulation film 16. After that, by using the CVD process, a second polysilicon film 17 having a film thickness of from 100 to 200 nm is formed to cover the entire surface of the floating gate covering insulation film 16. After that, by patterning this second polysilicon film 17, the control gate 11 is formed so that the second embodiment of the nonvolatile semiconductor memory device of the present invention is completed.

As is clear from the above description, also in the construction of this second embodiment of the present invention, the same effect as that obtained in the first embodiment of the present invention may be obtained.

In addition to the above, in the construction of this second embodiment of the present invention, it is possible to provide the source region common to the adjacent two memory cells, which enables the second embodiment of the present invention to increase the area size of the lower floating gate with respect to the control gate, and thereby increasing a capacitance between these gates and decreasing a voltage required in a write operation.

Third Embodiment

Figure 21:
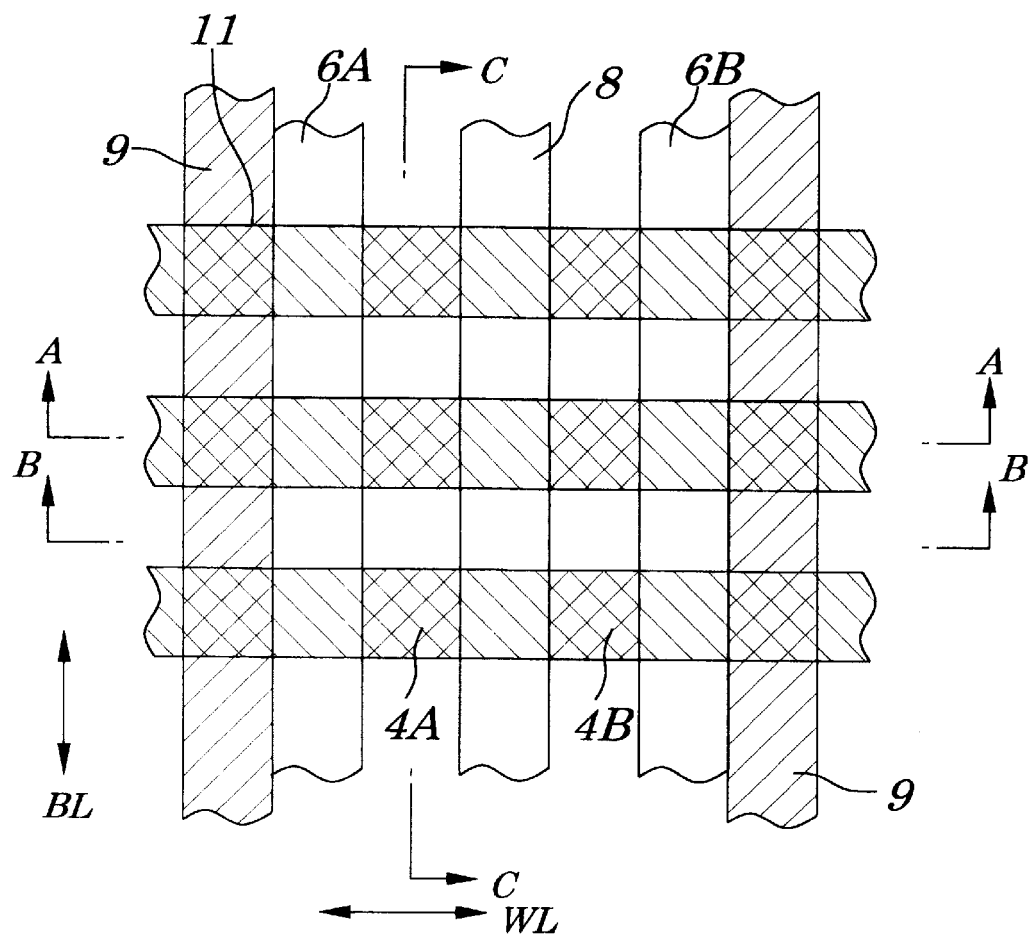
FIG. 21 is a plan view of a third embodiment of the nonvolatile semiconductor memory device of the present invention.
Figure 22:
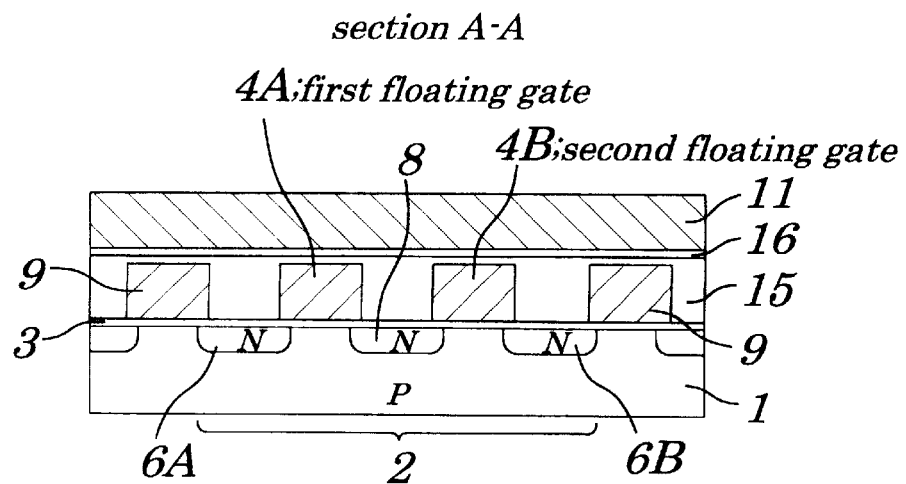
FIG. 22 is a cross-sectional view of the third embodiment of the nonvolatile semiconductor memory device of the present invention, taken along the line A—A of FIG. 21.
Figure 23:
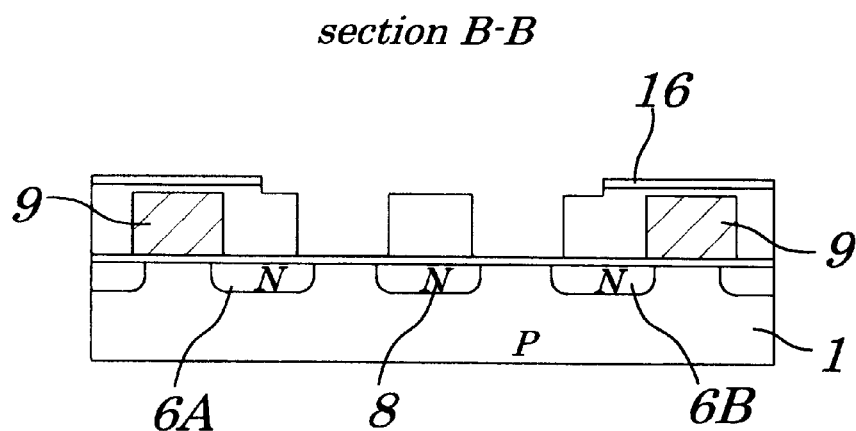
FIG. 23 is a cross-sectional view of the third embodiment of the nonvolatile semiconductor memory device of the present invention, taken along the line B—B of FIG. 21.
Figure 24:
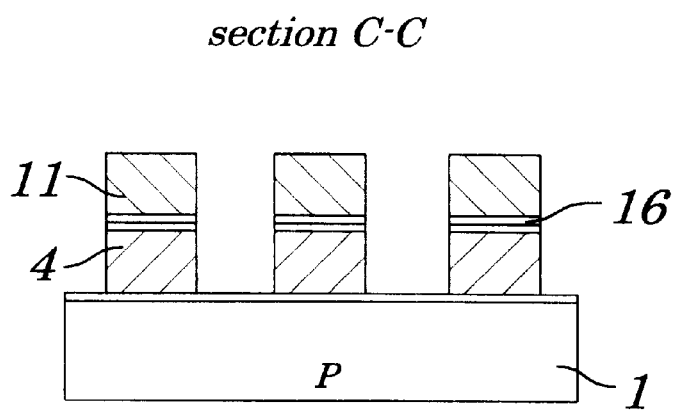
FIG. 24 is a cross-sectional view of the third embodiment of the nonvolatile semiconductor memory device of the present invention, taken along the line C—C of FIG. 21.
Figure 25:
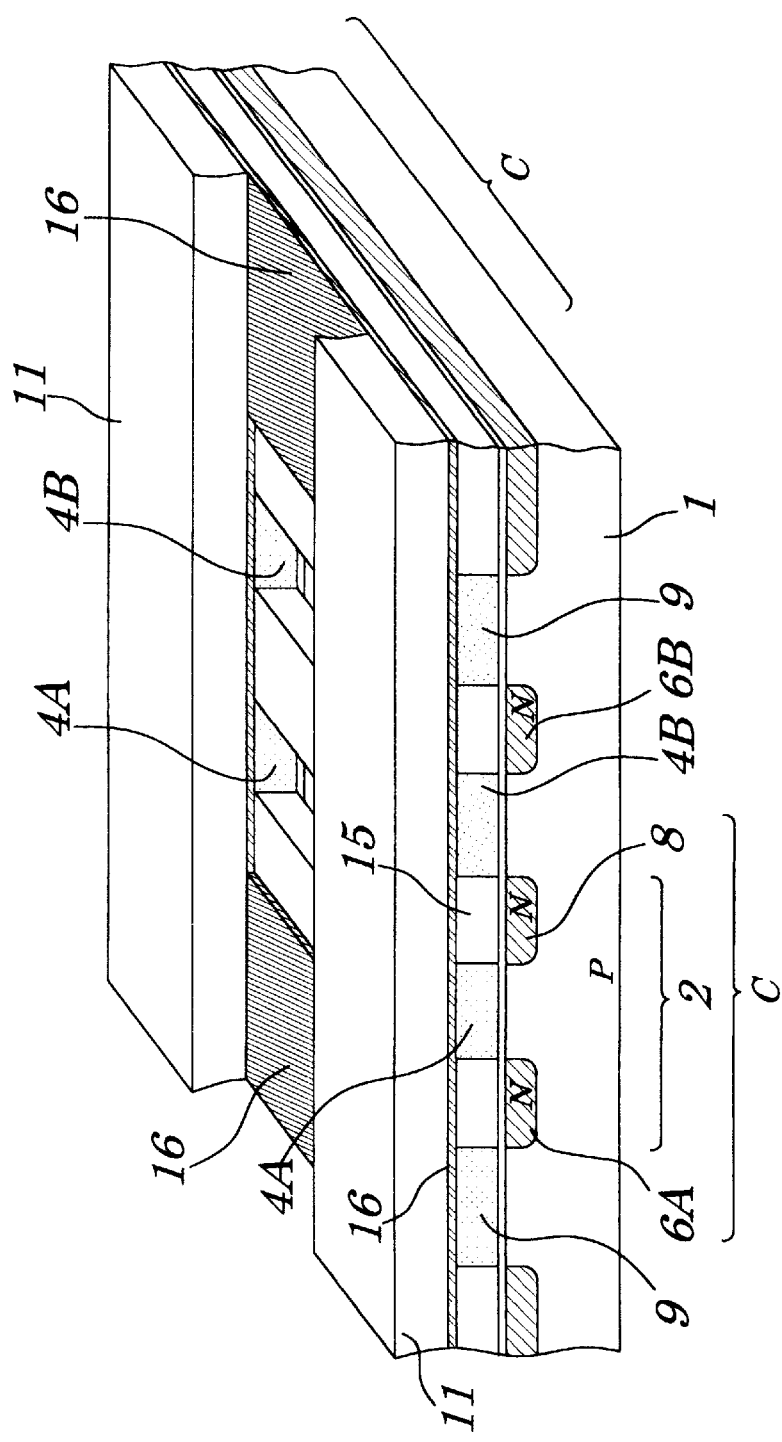
FIG. 25 is a perspective view of the third embodiment of the nonvolatile semiconductor memory device of the present invention shown in FIG. 21.

FIG. 21 shows a third embodiment of the nonvolatile semiconductor memory device of the present invention. FIG. 22 shows a cross-sectional view of the third embodiment of the memory device of the present invention, taken along the line A—A of FIG. 21. FIG. 23 shows another cross-sectional view of the third embodiment of the memory device of the present invention, taken along the line B—B of FIG. 21. FIG. 24 shows another cross-sectional view of the third embodiment of the memory device of the present invention, taken along the line C—C of FIG. 21. FIG. 25 shows a perspective view of the third embodiment of the nonvolatile semiconductor memory device of the present invention.

The third embodiment of the nonvolatile semiconductor memory device of the present invention is substantially similar in construction to the first embodiment of the nonvolatile semiconductor memory device of the present invention, except that the lower floating gate 4 of the first embodiment of the present invention is replaced with the first floating gate 4A and the second floating gates 4B of the third embodiment of the present invention, wherein the first and the second floating gates 4A, 4B of the third embodiment of the present invention extend in parallel with each other.

As shown in FIGS. 21 to 25, in the third embodiment of the nonvolatile semiconductor memory device of the present invention, the first floating gate 4A and the second floating gate 4B are disposed side by side, and extend along the bit lines BL. Disposed adjacent to the opposite end portions of the first floating gate 4A and the second floating gate 4B are an N-type drain regions 6A, 6B. On the other hand, disposed between the first floating gate 4A and the second floating gate 4B is the N-type source region 8. Consequently, A first memory transistor is constructed of: the first floating gate 4A, drain region 6A and the source region 8. On the other hand, a second memory transistor is constructed of: the second floating gate 4B, drain region 6B and the source region 8. Incidentally, as is clear from the above, the source region 8 is common to the first and the second memory transistor. Further, these regions 6A, 6B and the source region 8 serve as the buried diffusion layers, and cover adjacent ones of the memory cells, wherein the drain regions 6A, 6B are used as the bit lines BL.

The nonvolatile semiconductor memory device of the third embodiment of the present invention may be produced substantially by the same method as that used in production of the nonvolatile semiconductor memory device of the first embodiment of the present invention. In other words, in the processing steps shown in FIGS. 6A, 6B and 6C, the resist film is formed so as to have a pattern for forming the first floating gate 4A (shown in FIG. 21) and the second floating gate 4B (shown in FIG. 21). After that, the drain region 6A, 6B and the source region 8 (shown in FIG. 21) are formed in the opposite end portions of the first floating gate 4A (shown in FIG. 21) and the second floating gate 4B (shown in FIG. 21). Then, as shown in FIG. 21, the device isolation shielding electrode 9 is formed outside the drain regions 6A, 6B to cover the adjacent ones of the memory cells, wherein the adjacent ones of the memory cells extend in parallel with both the first floating gate 4A and the second floating gate 4B.

As is clear from the above description, also in the construction of this third embodiment of the present invention, the same effect as that obtained in the first embodiment of the present invention may be obtained.

In addition to the above, in the construction of this third embodiment of the present invention, it is possible to provide the source region common to the adjacent two memory cells, which enables the third embodiment of the present invention to realize a considerable area-size reduction of the memory cells thereof.

FIGS. 26 to 29 show examples of circuit diagrams of the nonvolatile semiconductor memory device of the present invention in which the buried diffusion layers are used as the bit lines.

Figure 26:
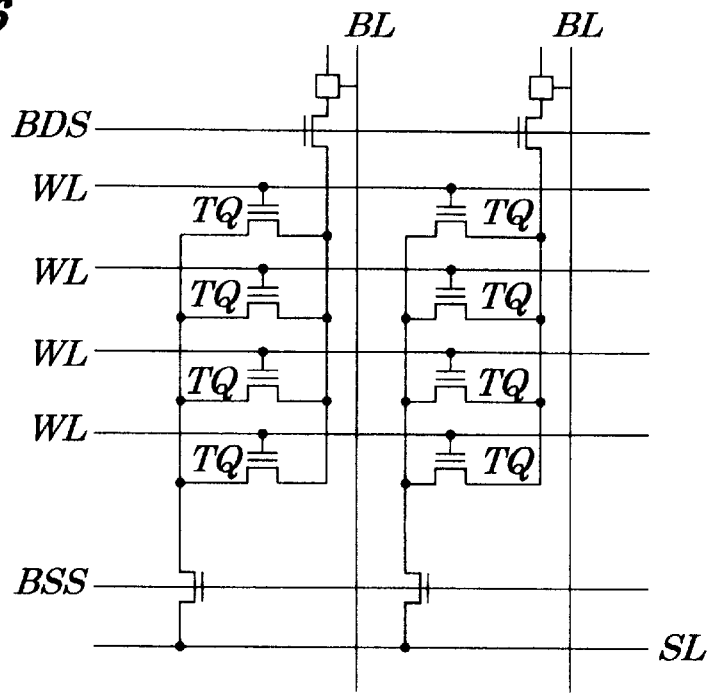
FIG. 26 is an AND (i.e., separate source line) type circuit diagram representing the nonvolatile semiconductor memory device of the present invention, wherein the buried diffusion layers are used as bit lines.

FIG. 26 shows an example of an AND (i.e., separate source line) type circuit diagram, in which a memory transistor TQ is connected with a word line WL. In FIG. 26: the reference letter "BL" denotes a bit line; and, "SL" denotes a source line. In this example of the circuit diagram shown in FIG. 26, the lines connecting the source side of the memory transistors TQ and the lines connecting the drain sides of the memory transistors TQ are constructed of the buried diffusion layers.

Figure 27:
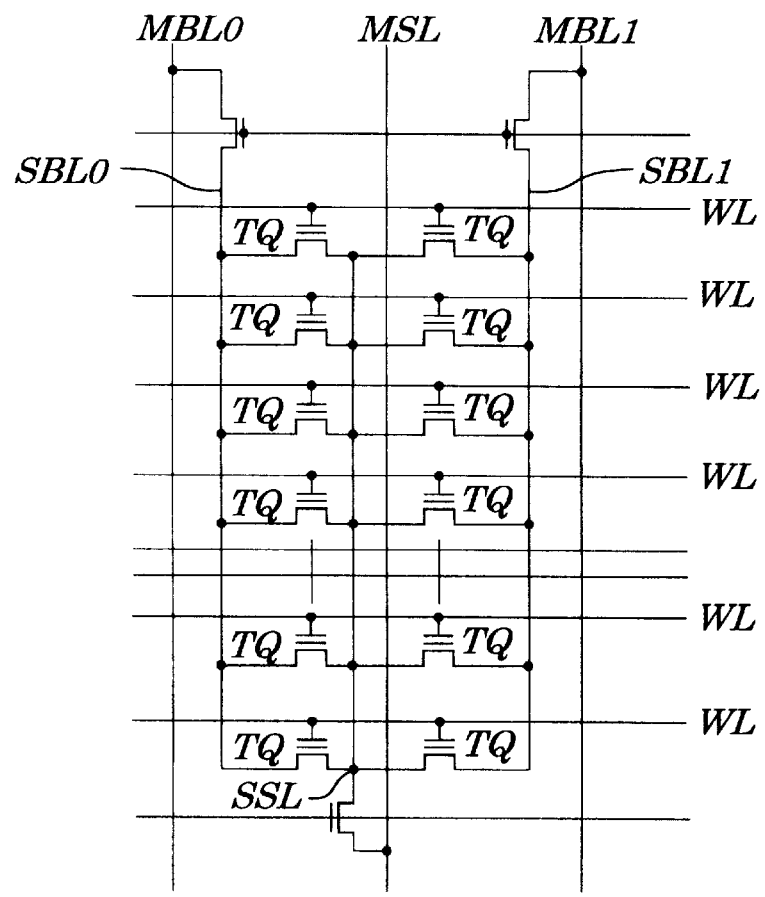
FIG. 27 is a common source line type circuit diagram representing the nonvolatile semiconductor memory device of the present invention, wherein the buried diffusion layers are used as bit lines.
Figure 28:
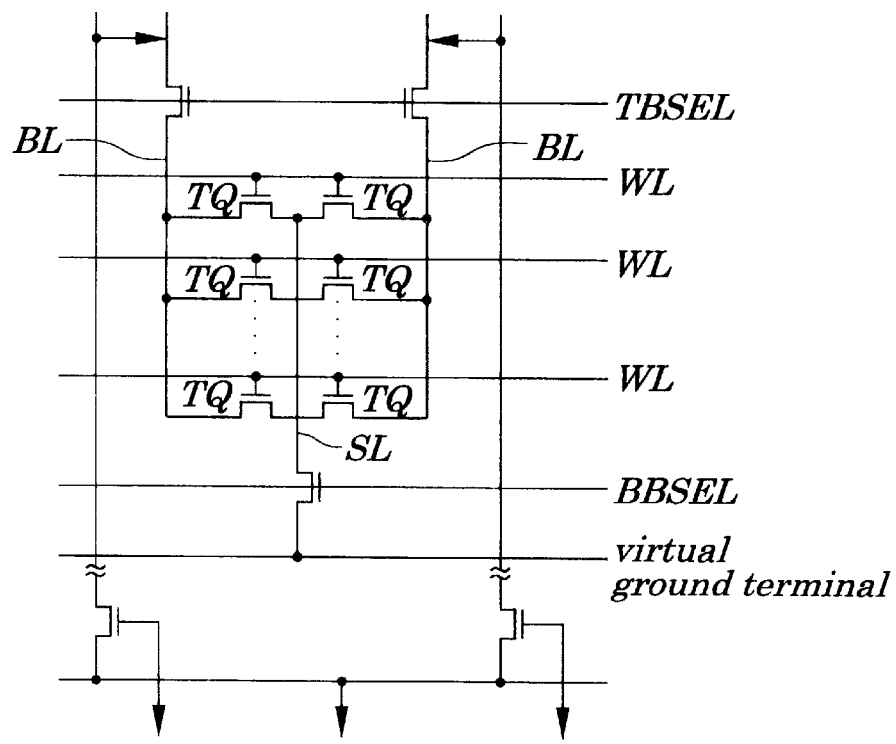
FIG. 28 is a common source line type circuit diagram, which includes a virtual ground terminal and represents the nonvolatile semiconductor memory device of the present invention, wherein the buried diffusion layers are used as bit lines.

FIGS. 27 and 28 show an example of a common source line type circuit diagram. As shown in these drawings, a pair of the memory transistors TQ are connected with each other side by side along the word line WL. In the drawings: the reference letters "MSL" denotes a main source line; "SSL" denotes a sub-source line; each of "MBL0" and "MBL1" denotes a main bit line; and, each of "SBL0" and "SBL1" denotes a sub-bit line. In this example of the common source line type circuit diagram shown in FIGS. 27 and 28, the diffusion layer disposed between the pair of the memory transistors TQ forms a source line without fail. In this example of the common source line type circuit diagram, each of the sub-source lines and the sub-bit lines is constructed of the buried diffusion layer.

Figure 29:
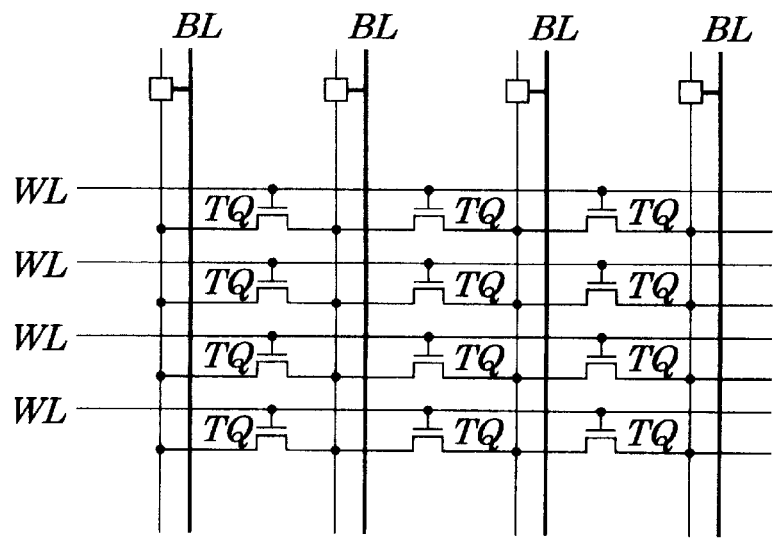
FIG. 29 is a VGA (i.e., Virtual Ground Array) type circuit diagram representing the nonvolatile semiconductor memory device of the present invention, wherein the buried diffusion layers are used as bit lines.

FIG. 29 shows an example of a virtual ground array (i.e., VGA) type circuit diagram, in which three memory transistors TQ are connected with each other side by side along the word line WL. In the example of the VGA type circuit diagram shown in FIG. 29, each line is connected with the source electrode or with the drain electrode depending upon a selected one of the memory transistors TQ. Further, in this example of the VGA type circuit diagram, the line connecting the source sides of the memory transistors TQ and the lines connecting the drain sides of the memory transistors TQ are constructed of the buried diffusion layers.

In the above, the various embodiments of the present invention have been described in detail. However, since many changes and modifications may be made to these embodiments without departing from the spirit of the present invention, it is intended that all matters given in the above description and illustrated in the accompanying drawings shall be interpreted to be illustrative only, and not as a limitation to the scope of the present invention. For example, in addition to the method of manufacturing the nonvolatile semiconductor memory device described above, it is also possible to apply the present invention to individual transistor cells each insulated from each other in a method of manufacturing a semiconductor device in which a plurality of transistor cells each provided with a gate electrode are integrated.

Further, the conductive material used in each of the lower floating gate, control gate, and the device isolation shielding electrode may be any other suitable material in addition to polysilicon, for example such as alloys of silicon and high-melting point metals comprising tungsten, molybdenum, tantalum and the like. Further, the gate oxide film may be constructed of a nitride film in addition to the oxide film, or may have a double-layered construction in which an oxide film and a nitride film are stacked together. In other words, in the present invention, as long as the semiconductor device is the MIS type transistor, it is also possible for the semiconductor device to be an MNS (i.e., Metal Nitride Semiconductor) type transistor or an MNOS (i.e., Metal Nitride Oxide Semiconductor) type transistor.

Further, in the present invention, the floating gate covering insulation film may be constructed of any of the ONO film, oxide films, single layer nitride film, or, any combination of the oxide films, and/or nitride films, and/or other insulation films. Further, in the present invention, as for the conductive type of the individual semiconductor regions, it is possible to replace the P-type ones with the N-type ones, or vice versa. In other words, the present invention is applicable to even the P-channel type MIS transistors in addition to the N-channel type MIS transistors. Furthermore, the film thickness of each of the above-mentioned insulation films and the conductive films and the type of the impurities described in the above are mere examples, and, therefore may be changed depending on application and purpose in use.

It is thus apparent that the present invention is not limited to the above embodiments but may be changed and modified without departing from the scope and spirit of the invention.

Finally, the present application claims the Convention Priority based on Japanese Patent Application No. Hei 11-014707 filed on Jan. 22, 1999, which is herein incorporated by reference.

What is claimed is:

1. In a nonvolatile semiconductor memory device provided with a plurality of integrated nonvolatile semiconductor memory cells each comprising: a lower floating gate;

a control gate formed on said lower floating gate through an insulation film; and a diffusion layer disposed adjacent to each of opposite end portions of said lower floating gate, the improvement wherein:

a device isolation shielding electrode line is formed outside said diffusion layer disposed adjacent to said opposite end portions of said lower floating gate; and, said device isolation shielding electrode line continuously extends between and in parallel with said lower floating gate to cover adjacent ones of said nonvolatile semiconductor memory cells.

2. The nonvolatile semiconductor memory device according to claim 1, wherein: an upper floating gate larger in area size than said lower floating gate is formed on said lower floating gate.

3. The nonvolatile semiconductor memory device according to claim 1, wherein:

said lower floating gate is constructed of a first floating gate and a second floating gate extending in parallel with said first floating gate; and, a common diffusion layer disposed adjacent to an area between said first and said second floating gate so as to be common to both said first and said second floating gate.

4. The nonvolatile semiconductor memory device according to claim 1, wherein: said lower floating gate is made of a predetermined conductive material, of which said device isolation shielding electrode line is also made.

5. The nonvolatile semiconductor memory device according to claim 4, wherein: said predetermined conductive material is constructed of polysilicon.

6. The nonvolatile semiconductor memory device according to claim 1, wherein: said diffusion layer covers adjacent ones of said nonvolatile semiconductor memory cells.

7. The nonvolatile semiconductor memory device according to claim 1, wherein: said lower floating gate is insulated in each of said nonvolatile semiconductor memory cells.

8. The nonvolatile semiconductor memory device according to claim 1, wherein: said diffusion layer is constructed of a source region or a drain region of each of said nonvolatile semiconductor memory cells.

9. The nonvolatile semiconductor memory device according to claim 1, wherein: said device isolation shielding electrode line is held at ground potential or at a source potential.

10. The nonvolatile semiconductor memory device according to claim 1, wherein: said diffusion layer serves as a bit line.

* * * * *